US011300597B2

(12) United States Patent
Olsson

(10) Patent No.: US 11,300,597 B2
(45) Date of Patent: Apr. 12, 2022

(54) SYSTEMS AND METHODS FOR LOCATING AND/OR MAPPING BURIED UTILITIES USING VEHICLE-MOUNTED LOCATING DEVICES

(71) Applicant: SeeScan Inc., San Diego, CA (US)

(72) Inventor: Mark S. Olsson, La Jolla, CA (US)

(73) Assignee: SeeScan, Inc., San Diego, CA (US)

( * ) Notice: Subject to any disclaimer, the term of this patent is extended or adjusted under 35 U.S.C. 154(b) by 333 days.

(21) Appl. No.: 15/497,040

(22) Filed: Apr. 25, 2017

(65) Prior Publication Data

US 2017/0307670 A1 Oct. 26, 2017

Related U.S. Application Data

(60) Provisional application No. 62/327,412, filed on Apr. 25, 2016.

(51) Int. Cl.
*G01R 29/08* (2006.01)
*G01V 3/15* (2006.01)
*G01V 3/165* (2006.01)

(52) U.S. Cl.
CPC .............. *G01R 29/085* (2013.01); *G01V 3/15* (2013.01); *G01V 3/165* (2013.01)

(58) Field of Classification Search
CPC . G01V 3/15; G01V 3/165; G01V 3/10; G01R 31/021; G01R 31/085; G01R 29/085; G01R 31/023; G05D 1/0265
See application file for complete search history.

(56) References Cited

U.S. PATENT DOCUMENTS

| 5,629,626 | A | 5/1997 | Russell et al. | |
|---|---|---|---|---|
| 7,336,078 | B1 | 2/2008 | Merewether et al. | |
| 7,443,154 | B1* | 10/2008 | Merewether | G01V 3/08 324/67 |
| 7,675,289 | B1* | 3/2010 | Stolarczyk | G01V 3/15 324/334 |
| 2002/0184235 | A1* | 12/2002 | Young | G01V 1/00 |
| 2006/0232259 | A1 | 10/2006 | Olsson et al. | |
| 2006/0247847 | A1* | 11/2006 | Carter | A47F 10/04 701/498 |
| 2010/0188245 | A1* | 7/2010 | Nielsen | G01V 3/08 340/686.1 |
| 2013/0127470 | A1 | 5/2013 | Olsson et al. | |

(Continued)

OTHER PUBLICATIONS

International Searching Authority, "Written Opinion of the International Searching Authority" for PCT Patent Application No. PCT/US17/029455, dated Nov. 20, 2017, European Patent Office, Munich.

*Primary Examiner* — Tung X Nguyen
*Assistant Examiner* — Feba Pothen
(74) *Attorney, Agent, or Firm* — Steven C. Tietsworth, Esq.; Michael J. Pennington, Esq.

(57) ABSTRACT

Systems and methods for locating and/or mapping buried utilities are disclosed. In one embodiment, one or more magnetic field sensing locating devices include antenna node(s) to sense magnetic field signals emitted from a buried utility and a processing unit to receive the sensed magnetic field signals may be mounted on a vehicle. The received magnetic field signals may be processed in conjunction with sensed vehicle velocity data to determine information associated with location of the buried utility such as depth and position.

27 Claims, 32 Drawing Sheets

(56) References Cited

U.S. PATENT DOCUMENTS

2014/0125509 A1    5/2014   Stolarczyk et al.
2015/0061659 A1*  3/2015   Freear .................... G01N 27/82
                                                      324/238
2015/0123664 A1    5/2015   Olsson et al.

\* cited by examiner

SYSTEMS AND METHODS FOR LOCATING AND/OR MAPPING BURIED UTILITIES USING VEHICLE-MOUNTED LOCATING DEVICES

FIELD

The present disclosure relates generally to systems and methods for locating and/or mapping buried utilities. More specifically, but not exclusively, the disclosure relates to systems and methods for locating and/or mapping buried utilities using vehicle-mounted locating devices.

BACKGROUND

Locating devices (interchangeably referred as "utility locators", or simply "locators") for detecting utilities that are buried or obscured from plain sight are known in the art. Such locating devices are generally hand-held locators capable of sensing magnetic fields emitted from hidden or buried utilities (e.g., underground utilities such as pipes, conduits, or cables) or other conductors, and processing the received signals to determine information about the conductors and the associated underground environment.

Traditional methods for locating utilities (referred to as 'locate operation', or simply 'locate') using such locating devices involve a manual technique where a technician carries a locating device in hand and moves about the geographical region to search for the presence of the buried utility based on audio and/or visual feedback from the locating device. Such methods, though useful, requires a technician to hold the locating device in a still and upright position above the ground for lengthy periods of time to locate buried utilities. Further, these methods are limited to locating utilities within small and/or confined geographical regions In instances where the geographical region to be searched include streets and intersections, such a manual method of locating utilities can only be performed during night hours. Moreover, it is often required to seek approval from designated authorities before initiating the manual locate operation on the streets and intersections. It is challenging and almost impractical to use such methods when the geographical regions to be searched span across miles or include multiple areas and/or cities, or include freeways, highways, busy streets, and the like.

In recent years, few semi-automated methods of locating and/or mapping utilities have been developed. However, such methods are unnecessarily complex in nature, expensive, and some of these methods require an overhead of fixing radio signaling devices at regular spaced intervals along the geographical locations of interest. Further, such methods have a limited use in locating and/or mapping utilities at specific geographical locations only. Also, these are unsuitable for use in geographical regions including busy streets, freeways, highway, and the like.

Accordingly, there is a need in the art of global, precise, easy to use, cost effective, and efficient systems and methods for locating and/or mapping utilities that addresses the above-described as well as other problems.

SUMMARY

This disclosure relates generally to systems, and methods for locating and/or mapping buried utilities. More specifically, but not exclusively, the disclosure relates to systems and methods for locating and/or mapping buried utilities using one or more magnetic field sensing locating devices mounted on a vehicle.

In one aspect, the present disclosure relates to a system for locating and/or mapping buried utilities having one or more magnetic field sensing locating devices mounted on a vehicle and supported thereon by at least a partially non-magnetic and non-electrically conductive support assembly. The locating devices, in operation, senses one or more utilities buried along or across a path of the vehicle, and collects utility data pertaining to such buried utilities. The locating devices may include, amongst several other components, a processing unit programmed to receive a vehicle velocity data and to process the utility data in conjunction with the vehicle velocity data to determine information associated with the location of the buried utilities.

In other aspects, the present disclosure relates to a system for locating and/or mapping buried utilities. The system may include at least one magnetic field sensing locating device mounted on a vehicle. The locating device may include at least one antenna node to sense one or more utilities buried along or across a path of the vehicle, and collect, in response to sensing, utility data pertaining to the buried utility. Further, the locating device may include a processing unit coupled to the antenna node, to process the utility data in conjunction with a velocity of the moving vehicle to detect location of the buried utility.

In other aspects, the present disclosure relates to a system for locating and/or mapping buried utilities having one or more magnetic field sensing locating devices mounted on a vehicle and supported thereon by a support assembly. The locating devices may include, amongst several other components, a processing unit configured to locate utilities buried along a path of the vehicle, which may be moving at a speed of more than 3 meters per second (m/s).

In other aspects, the present disclosure relates to a system for locating and/or mapping buried utilities having one or more magnetic field sensing locating devices mounted on a vehicle, where each of the locating devices may be configured to simultaneously receive and process a combination of passive radio broadcast signals and active multi-frequency magnetic field signals emitted from a buried utility and detect, based in part on the passive radio broadcast signals and active multi-frequency magnetic field signals, location, orientation and depth of the buried utility.

In other aspects, the present disclosure relates to a system for locating and/or mapping buried utilities. The system may include a pair of locating devices mounted on a moving vehicle in a spaced apart relationship, a support assembly for receiving and supporting the locating devices thereon in a fixed orientation, and a positioning device operably coupled to each of the locating devices and located centrally from each of the locating devices at a predefined position relative to one or more antenna arrays disposed in each of the locating devices to process data received from the locating devices. The positioning device may be, for instance, a Global Positioning System (GPS) or Global Navigation Satellite System (GNSS) antenna located in the middle of a horizontal plane common to antenna arrays of the locating devices.

In other aspects, the present disclosure relates to a system for locating and/or mapping buried utilities. The system may include a plurality of magnetic field sensing locating devices, including at least a first locating device and a second locating device supported by at least a partially non-metallic and/or non-electrically conductive support assembly, which may include an elongated frame attached to and extending transversely from a hitch receiver of the vehicle. The elongated frame may have locator mounting assemblies at two opposing ends thereof to receive and support the first locating device and the second locating device in a spaced-apart relationship on the moving vehicle, whereby each of the first locating device and the second locating device may detect a location of the buried utility. The system may further include a positioning device coupled to the first locating device and the second locating device and supported on an elongated mast projecting outwardly from a central mounting assembly positioned centrally from the locator mounting assemblies over the partially non-metallic and/or non-electrically conductive support assembly. The positioning device may generate one or more absolute positions of the buried utility based on the location of the buried utility detected by the first locating device and the second locating device.

In other aspects, the present disclosure relates to a system for locating and/or mapping buried utilities. The system may include a plurality of magnetic field sensing locating devices mounted onto a plurality of vehicles for locating one or more buried utilities when moving along or across path(s) of the buried utilities. The system may include a remote server communicatively coupled to the locating devices to obtain data pertaining to the buried utilities from the locating devices, which may be stored in a database associated with the remote server. The remote server may include various modules and/or components to process the utility data based on preconfigured algorithms, techniques, rules, and/or parameters, to detect optimized and/or probable locations of the utilities, and/or generate corresponding maps to display such detected locations. The maps may be provided to corresponding users on their electronic devices.

In other aspects, the present disclosure relates to a system for locating and/or mapping buried utilities. The system may include a magnetic field sensing locating device coupled to a positioning device supplying a precise pulse synchronization signal to the locating device. The locating device may be mounted on a vehicle to collect utility data pertaining to a buried utility upon sensing the buried utility while moving along or across a path of the buried utility. The locating device may include a processing unit configured to timestamp at least a portion of the collected utility data relative to the precise pulse synchronization signal obtained from the positioning device.

In other aspects, the present disclosure relates to a system for locating and/or mapping buried utilities. The system may include a first magnetic field sensing locating device mounted on a vehicle. The first magnetic field sensing locating device may include a first processing unit configured to collect utility data pertaining to a buried utility at a first set of location data points; the first processing unit may include a first slave clock configured to synchronize to a master clock to timestamp the collected utility data collected in accordance with the first slave clock. The system may further include a second magnetic field sensing locating device mounted on the moving vehicle. The second magnetic field sensing locating device may include a second processing unit configured to collect utility data pertaining to a buried utility at a second set of location data points. The second processing unit may include a second slave clock synchronized to the master clock to timestamp the collected utility data in accordance with the second slave clock. Furthermore, the system may include a positioning device coupled to the first locating device and the second locating device. The positioning device may include the master clock. The positioning device may correlate the time-stamped utility data collected at the first set of location data points and the second set of location data points in a time domain to detect and trace a location of the buried utility within the geographical region.

In other aspects, the present disclosure relates to a method for locating and/or mapping buried utilities. The method may include obtaining, by a locating device mounted on a vehicle, utility data pertaining to a buried utility, detecting location of the buried utility based in part on the utility data, and providing the location of the buried utility to an electronic device associated with the vehicle. The method may further include updating the location as the vehicle moves along a general path of the buried utilities.

In other aspects, the present disclosure relates to a method for locating and/or mapping buried utilities. The method may include obtaining, by a remote server, aggregated utility data pertaining to a buried utility collected by a plurality of locating devices mounted onto a plurality of vehicles moving along a path of the buried utility, detecting, based in part on the aggregated utility data, an optimized location of the buried utility, and subsequently generating a map indicative of the optimized location of the buried utility, which may be displayed on electronic devices associated with respective vehicles.

In other aspects, the present disclosure relates to a method for locating and/or mapping buried utilities. The method may include obtaining, by a remote server, aggregated utility data pertaining to a buried utility collected by a plurality of locating devices mounted onto a plurality of vehicles moving along or across a general path of the buried utilities, detecting, based in part on the aggregated utility data, an optimized location of the buried utility, and subsequently generating a map indicative of the optimized location of the buried utility. The map may be displayed on electronic devices associated with respective vehicles.

In other aspects, the present disclosure relates to a method for locating and/or mapping buried utilities. The method may include obtaining, by a remote system, aggregated utility data pertaining to a buried utility collected by a plurality of locating devices mounted onto a plurality of vehicles moving along a path of the buried utility, ascertaining a set of locations (e.g. in form of location data points) for the buried utility based on the aggregated utility data, evaluating probability scores for the set of locations, and generating a map depicting a probability contour indicative of probable locations of the buried utility with associated probability scores.

Various additional aspects, features, and functionality are further described below in conjunction with the appended Drawings.

BRIEF DESCRIPTION OF THE DRAWINGS

The present application may be more fully appreciated in connection with the following detailed description taken in conjunction with the accompanying drawings, wherein.

DETAILED DESCRIPTION OF EMBODIMENTS

Terminology

Figure 1A:
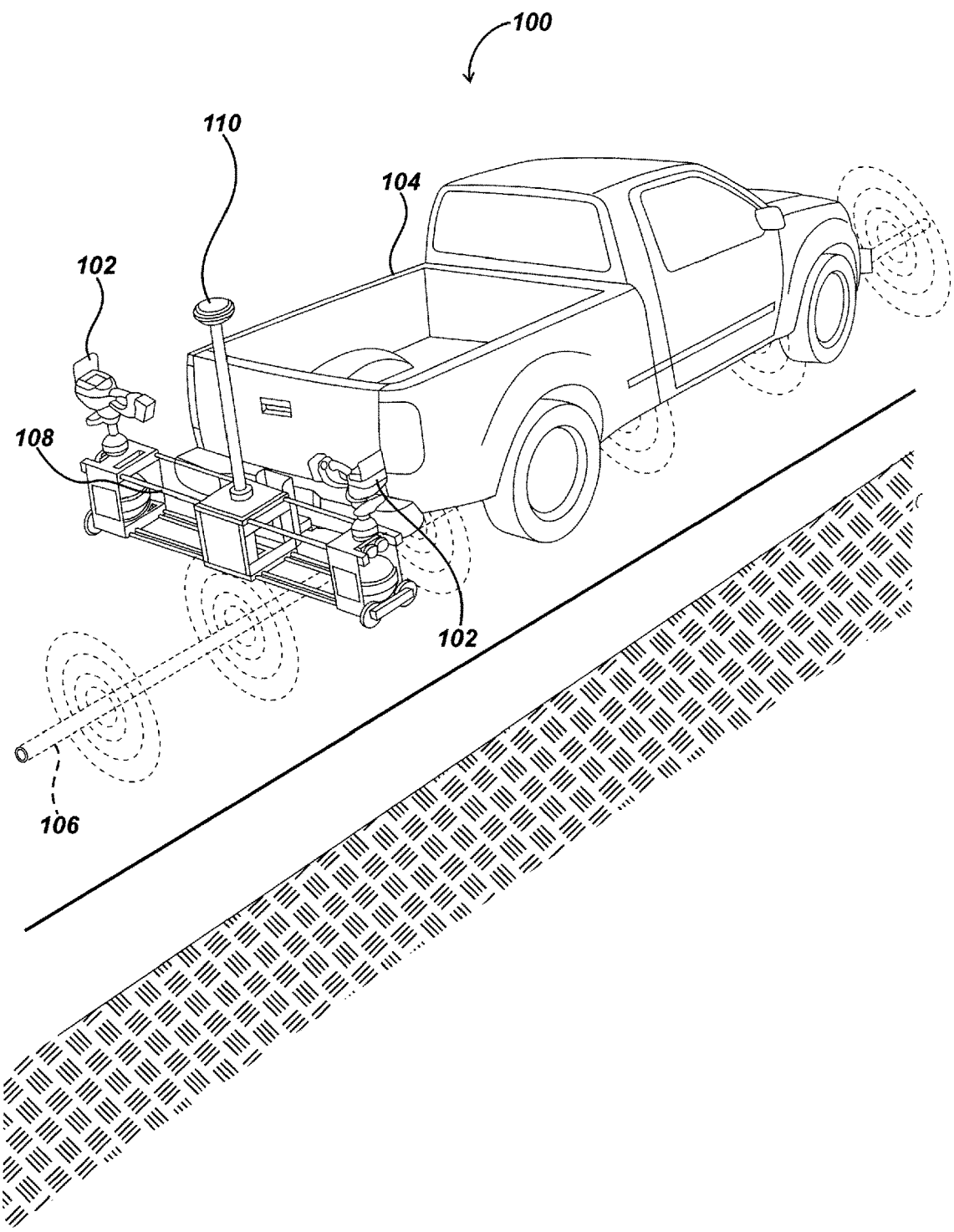
FIGS. 1A-1B illustrate embodiments of a system for locating and/or mapping buried utilities using vehicle-mounted locating devices.

The term "buried utilities" as used herein refers not only to utilities below the surface of the ground, but also to utilities that are otherwise obscured, covered, or hidden from direct view or access (e.g. overhead power lines, underwater utilities, and the like). In a typical application a buried utility is a pipe, cable, conduit, wire, or other object buried under the ground surface, at a depth of from a few centimeters to meters or more, that a user, such as a utility company employee, construction company employee, homeowner or others want to locate, map (e.g., by surface position as defined by latitude/longitude or other surface coordinates, and/or also by depth), measure, and/or provide a surface mark corresponding to it using paint, electronic marking techniques, images, video or other identification or mapping techniques.

The term 'utility data' as used herein, may include, but is not limited to, the presence or absence, position, depth, current flow magnitude, phase, direction, and/or orientation of underground utility lines and/or other conductors. The utility data may further include information pertaining to soil properties, other changes in properties of pipes or other conductors in time and/or space, quality metrics of measured data, and/or other aspects of the utility and radio broadcast signals and/or the locate environment. The utility data may also include data received from various sensors, such as motion sensors, temperature sensors, humidity sensors, light sensors, barometers, sound, gas, radiation sensors, and other sensors provided within or coupled to the locating devices. The utility data may further include data received from ground tracking device(s) and camera element(s) provided within or coupled to the locating devices. The utility data may also include timestamps associated with the utility data. The utility data may be in the form of magnetic field signals radiated from the buried utility. The magnetic field signals may include active magnetic field signals directly associated with the buried utility, and passive magnetic field signal (e.g., radio broadcast signal radiated from a radio broadcast station), which when encountering a portion of a buried utility, induces a current in the buried utility that generates an electromagnetic field around the buried utility. Typical embodiments use broadcast signals from commercial radio systems such as the AM radio system in the United States, however, other transmitted radio signals may be used in alternate embodiments. For example, an AM broadcast radio tower used by a commercial AM radio station may transmit a radio signal from a distance that is measurable within the locate operation area.

The term 'electronic device' as used herein refers to any device or system that can be operated or controlled by electrical, optical, or other outputs from a user interface device. Examples of an electronic device include, but are not limited to, vehicle-mounted display devices, navigation systems such as global positioning system receivers, personal computers, notebook or laptop computers, personal digital assistants (PDAs), cellular phones, computer tablet devices, electronic test or measurement equipment including processing units, and/or other similar systems or devices. The electronic device may further include a map application or equivalent software stored on a non-transitory tangible storage medium to receive, send, generate, modify, display, store, and/or otherwise use or manipulate maps or its associated objects.

As used herein, the term "map" refers to imagery, diagrams, graphical illustrations, line drawings or other representations depicting the attributes of a location. Examples may include maps or images containing various dimensions (i.e. two dimensional (2D) maps or images and/or three dimensional (3D) maps or images). These may be vector or raster objects and/or combinations of both. Such depictions and/or representations may be used for navigation and/or relaying information associated with positions or locations, and may also contain information associated with the positions or locations such as coordinates, information defining features, images or video depictions, and/or other related data or information. For instance, the spatial positioning of ground surface attributes may be depicted through a series of photographs or line drawings or other graphics representing a location. Other data, for example, reference coordinate information such as latitude, longitude, and/or altitude data, topographical information, virtual models/objects, information regarding buried utilities or other associated objects or elements, structures on or below the surface, and the like may be embedded or otherwise included into maps.

As used herein, the term, "exemplary" means "serving as an example, instance, or illustration." Any aspect, detail, function, implementation, and/or embodiment described herein as "exemplary" is not necessarily to be construed as preferred or advantageous over other aspects and/or embodiments.

Overview

The present disclosure relates generally to systems and methods for locating and/or mapping buried utilities. More specifically, but not exclusively, the disclosure relates to systems and methods for locating and/or mapping buried utilities using vehicle-mounted locating devices.

The systems and methods, according to one aspect, may include one or more magnetic field sensing locating devices (hereinafter referred to as 'locating devices') mounted on a vehicle. These locating devices may include, amongst several other components, a processing unit programmed to locate one or more buried utilities at a moving speed of the vehicle, which in a typical example is more than 3 m/s. The located utilities may be mapped and provided to electronic device(s) associated with corresponding vehicles. The locating devices may be supported on the vehicle by a support assembly, in several different orientations and/or arrangements, some of which will be described later in the description.

The systems and methods may further include a remote server communicatively coupled to the locating devices mounted on the vehicles. In one aspect, the remote server may be implemented in a cloud environment where the remote server may correspond to a cloud server operably coupled to the locating devices, and the database may correspond to a cloud database coupled to the cloud server.

The remote server may be configured to obtain data (hereinafter referred to as 'utility data') pertaining to the buried utilities from the locating devices, maintain a database for storing utility data obtained collaboratively from multiple sources including, but not limited to, the locating devices mounted on a plurality of vehicles, and process such utility data based on preconfigured algorithms, techniques, rules, and/or parameters, to detect location of each of the buried utilities, which in some examples, is a precise and optimized location, and in other examples, is a set of probable locations of the utilities also existing "as built" utility maps.

Based on the detected locations, the remote server may generate one or more maps, which may be provided to corresponding users (interchangeably referred to as 'operator' or 'vehicle operator') on their electronic devices, via a suitable communication channel. According to different aspects, the remote server may either be configured to post-process the utility data, or process the utility data in real-time or near real time.

Details of the locating devices referred herein, additional components, methods, and configurations that may be used in conjunction with the embodiments described subsequently herein are disclosed in co-assigned patent applications including U.S. Pat. No. 7,009,399, issued Mar. 7, 2006, entitled OMNIDIRECTIONAL SONDE AND LINE LOCATOR; U.S. Pat. No. 7,136,765, issued Nov. 14, 2006, entitled A BURIED OBJECT LOCATING AND TRACING METHOD AND SYSTEM EMPLOYING PRINCIPAL COMPONENTS ANALYSIS FOR BLIND SIGNAL DETECTION; U.S. Pat. No. 7,221,136, issued May 22, 2007, entitled SONDES FOR LOCATING UNDERGROUND PIPES AND CONDUITS; U.S. Pat. No. 7,276,910, issued Oct. 2, 2007, entitled COMPACT SELF-TUNED ELECTRICAL RESONATOR FOR BURIED OBJECT LOCATOR APPLICATIONS; U.S. Pat. No. 7,288,929, issued Oct. 30, 2007, entitled INDUCTIVE CLAMP FOR APPLYING SIGNAL TO BURIED UTILITIES; U.S. Pat. No. 7,332,901, issued Feb. 19, 2008, entitled LOCATOR WITH APPARENT DEPTH INDICATION; U.S. Pat. No. 7,336,078, issued Feb. 26, 2008, entitled MULTI-SENSOR MAPPING OMNIDIRECTIONAL SONDE AND LINE LOCATORS; U.S. Pat. No. 7,557,559, issued Jul. 7, 2009, entitled COMPACT LINE ILLUMINATOR FOR LOCATING BURIED PIPES AND CABLES; U.S. Pat. No. 7,619,516, issued Nov. 17, 2009, entitled SINGLE AND MULTI-TRACE OMNIDIRECTIONAL SONDE AND LINE LOCATORS AND TRANSMITTER USED THEREWITH; U.S. Pat. No. 7,733,077, issued Jun. 8, 2010, entitled MULTI-SENSOR MAPPING OMNIDIRECTIONAL SONDE AND LINE LOCATORS AND TRANSMITTER USED THEREWITH; U.S. Pat. No. 7,741,848, issued Jun. 22, 2010, entitled ADAPTIVE MULTICHANNEL LOCATOR SYSTEM FOR MULTIPLE PROXIMITY DETECTION; U.S. Pat. No. 7,755,360, issued Jul. 13, 2010, entitled PORTABLE LOCATOR SYSTEM WITH JAMMING REDUCTION; U.S. patent application Ser. No. 12/939,591, filed Nov. 4, 2010, entitled SMART PERSONAL COMMUNICATION DEVICES AS USER INTERFACES; U.S. Pat. No. 7,830,149, issued Nov. 9, 2010, entitled AN UNDERGROUND UTILITY LOCATOR WITH A TRANSMITTER, A PAIR OF UPWARDLY OPENING POCKETS AND HELICAL COIL TYPE ELECTRICAL CORDS; U.S. Pat. No. 7,969,151, issued Jun. 28, 2011, entitled PRE-AMPLIFIER AND MIXER CIRCUITRY FOR A LOCATOR ANTENNA; U.S. Pat. No. 8,013,610, issued Sep. 6, 2011, entitled HIGH-Q SELF TUNING LOCATING TRANSMITTER; U.S. Pat. No. 8,203,343, issued Jun. 19, 2012, entitled RECONFIGURABLE PORTABLE LOCATOR EMPLOYING MULTIPLE SENSOR ARRAY HAVING FLEXIBLE NESTED ORTHOGONAL ANTENNAS; U.S. Pat. No. 8,248,056, issued Aug. 21, 2012, entitled BURIED OBJECT LOCATOR SYSTEM EMPLOYING AUTOMATED VIRTUAL DEPTH EVENT DETECTION AND SIGNALING; U.S. patent application Ser. No. 13/605,960, filed Sep. 6, 2012, entitled SYSTEMS AND METHODS FOR LOCATING BURIED OR HIDDEN OBJECTS USING SHEET CURRENT FLOW MODELS; U.S. Pat. No. 8,264,226, issued Sep. 11, 2012, entitled SYSTEM AND METHOD FOR LOCATING BURIED PIPES AND CABLES WITH A MAN PORTABLE LOCATOR AND A TRANSMITTER IN A MESH NETWORK; U.S. patent application Ser. No. 13/676,989, filed Nov. 14, 2012, entitled QUAD-GRADIENT COILS FOR USE IN LOCATING SYSTEMS; U.S. patent application Ser. No. 13/677,223, filed Nov. 14, 2012, entitled MULTI-FREQUENCY LOCATING SYSTEMS AND METHODS; U.S. patent application Ser. No. 13/769,202, filed Feb. 15, 2013, entitled SMART PAINT STICK DEVICES AND METHODS; U.S. patent application Ser. No. 13/774,351, filed Feb. 22, 2013, entitled DOCKABLE TRIPODAL CAMERA CONTROL UNIT; U.S. patent application Ser. No. 13/787,711, filed Mar. 6, 2013, entitled DUAL SENSED LOCATING SYSTEMS AND METHODS; U.S. Pat. No. 8,400,154, issued Mar. 19, 2013, entitled LOCATOR ANTENNA WITH CONDUCTIVE BOBBIN; U.S. patent application Ser. No. 13/851,951, filed Mar. 27, 2013, entitled DUAL ANTENNA SYSTEMS WITH VARIABLE POLARIZATION; U.S. patent application Ser. No. 13/894,038, filed May 14, 2013, entitled OMNI-INDUCER TRANSMITTING DEVICES AND METHODS; U.S. patent application Ser. No. 13/958,492, filed Aug. 2, 2013, entitled OPTICAL ROUND TRACKING APPARATUS, SYSTEMS AND METHODS; U.S. patent application Ser. No. 14/022,067, filed Sep. 9, 2013, entitled USER INTERFACES FOR UTILITY LOCATORS; U.S. patent application Ser. No. 14/027,027, filed Sep. 13, 2013, entitled SONDE DEVICES INCLUDING A SECTIONAL FERRITE CORE STRUCTURE; U.S. patent application Ser. No. 14/077,022, filed Nov. 11, 2013, entitled WEARABLE MAGNETIC FIELD UTILITY LOCATOR SYSTEM WITH SOUND FIELD GENERATION; U.S. Pat. No. 8,547,428, issued Oct. 1, 2013, entitled PIPE MAPPING SYSTEM; U.S. Pat. No. 8,635,043, issued Jan. 21, 2014, entitled Locator and Transmitter Calibration System; U.S. patent application Ser. No. 14/332,268, filed Jul. 15, 2014, entitled UTILITY LOCATOR TRANSMITTER DEVICES, SYSTEMS, AND METHODS WITH DOCKABLE APPARATUS; U.S. patent application Ser. No. 14/446,145, filed Jul. 29, 2014, entitled UTILITY LOCATING SYSTEMS WITH MOBILE BASE STATION; U.S. patent application Ser. No. 14/446,279, filed Jul. 29, 2014, entitled INDUCTIVE CLAMP DEVICES, SYSTEMS, AND METHODS; U.S. patent application Ser. No. 14/516, 558, filed Oct. 16, 2014, entitled ELECTRONIC MARKER DEVICES AND SYSTEMS; U.S. patent application Ser. No. 14/580,097, filed Dec. 22, 2014, entitled NULLED-SIGNAL LOCATING DEVICES, SYSTEMS, AND METHODS; U.S. Pat. No. 9,057,754, issued Jun. 16, 2015, entitled ECONOMICAL MAGNETIC LOCATOR APPARATUS AND METHOD; U.S. patent application Ser. No. 14/752,834, filed Jun. 27, 2015, entitled GROUND TRACKING APPARATUS, SYSTEMS, AND METHODS; U.S. patent application Ser. No. 14/797,840, filed Jul. 13, 2015, entitled GROUND-TRACKING DEVICES AND METHODS FOR USE WITH A UTILITY LOCATOR; U.S. patent application Ser. No. 14/798,177, filed Jul. 13, 2015, entitled MARKING PAINT APPLICATOR FOR USE WITH PORTABLE UTILITY LOCATOR; U.S. Pat. No. 9,081,109, issued Jul. 14, 2015, entitled GROUND-TRACKING DEVICES FOR USE WITH A MAPPING LOCATOR; U.S. Pat. No. 9,082,269, issued Jul. 14, 2015, entitled HAPTIC DIRECTIONAL FEEDBACK HANDLES FOR LOCATION DEVICES; U.S. patent application Ser. No. 14/802,791, filed Jul. 17, 2015, entitled METHODS AND SYSTEMS FOR SEAMLESS TRANSITIONING IN INTERACTIVE MAPPING SYSTEMS; U.S. Pat. No. 9,085,007, issued Jul. 21, 2015, entitled MARKING PAINT APPLICATOR FOR PORTABLE LOCATOR; U.S. Provisional Patent Application 62/244,658, filed Oct. 21, 2015, entitled SIGNAL KEYING UTILITY LOCATING DEVICES, SYSTEMS, AND METHODS; U.S. patent application Ser. No. 14/949,868, filed Nov. 23, 2015, entitled BURIED OBJECT LOCATOR APPARATUS AND SYSTEMS; U.S. Provisional Patent Application 62/260,199, filed Nov. 25, 2015, entitled UTILITY LOCATING SYSTEMS, DEVICES, AND METHODS USING RADIO BROADCAST SIGNALS; U.S. patent application Ser. No. 15/006,119, filed Jan. 26, 2016, entitled SELF-STANDING MULTI-LEG ATTACHMENT DEVICES FOR USE WITH UTILITY LOCATORS; U.S. Provisional Patent Application 62/295,502, filed Feb. 16, 2016, entitled BURIED UTILITY MARKER DEVICES, SYSTEMS, AND METHODS; U.S. Provisional Patent Application 62/307,365, filed Mar. 11, 2016, entitled UTILITY LOCATOR SUPPORT STRUCTURES; U.S. Provisional Patent Application 62/327,412, filed Apr. 25, 2016, entitled SYSTEMS AND METHODS FOR LOCATING AND/OR MAPPING BURIED UTILITIES USING VEHICLE MOUNTED LOCATING DEVICES; U.S. Pat. No. 9,341,740, issued May 17,2016, entitled OPTICAL GROUND TRACKING APPARATUS, SYSTEMS, AND METHODS; U.S. Provisional Patent Application 62/350,147, filed Jun. 14, 2016, entitled TRACKABLE DIPOLE DEVICES, METHODS, AND SYSTEMS FOR USE WITH MARKING PAINT STICKS; U.S. Provisional Patent Application 62/352,731, filed Jun. 21, 2016, entitled SYSTEMS AND METHODS FOR UNIQUELY IDENTIFYING BURIED UTILITIES IN A MULTI-UTILITY ENVIRONMENT; U.S. Pat. No. 9,411, 067, issued Aug. 9, 2016, entitled GROUND-TRACKING SYSTEMS AND APPARATUS; U.S. patent application Ser. No. 15/247,503, filed Aug. 25, 2016, entitled LOCATING DEVICES, SYSTEMS, AND METHODS USING FREQUENCY SUITES FOR UTILITY DETECTION; U.S. patent application Ser. No. 15/250,666, filed Aug. 29, 2016, entitled PHASE-SYNCHRONIZED BURIED OBJECT TRANSMITTER AND LOCATOR METHODS AND APPARATUS; U.S. Pat. No. 9,435,907, issued Sep. 6, 2016, entitled PHASE SYNCHRONIZED BURIED OBJECT LOCATOR APPARATUS, SYSTEMS, AND METHODS; and U.S. Pat. No. 9,465,129, issued Oct. 11, 2016, entitled IMAGE-BASED MAPPING LOCATING SYSTEM. The content of each of the above-described applications is hereby incorporated by reference herein in its entirety. The above applications may be collectively denoted herein as the "co-assigned applications" or "incorporated applications."

The following exemplary embodiments are provided for the purpose of illustrating examples of various aspects, details, and functions of the present disclosure; however, the described embodiments are not intended to be in any way limiting. It will be apparent to one of ordinary skill in the art that various aspects may be implemented in other embodiments within the spirit and scope of the present disclosure.

The present disclosure relates to systems and methods for locating and/or mapping buried utilities using one or more locating devices mounted on a vehicle, optionally in combination with hand carried devices.

In one aspect, the present disclosure relates to locating and/or mapping a buried utility quickly, precisely, and cost-effectively.

In another aspect, the present disclosure relates to locating buried utilities using one or more locating devices mounted on a vehicle moving at a speed of at least 3 m/s.

In another aspect, the present disclosure relates to locating buried utilities using one or more locating devices mounted on a high-speed moving vehicle.

In another aspect, the present disclosure relates to locating buried utilities using one or more locating devices supported on a vehicle by at least a partially non-metallic and/or non-electrically conductive support assembly.

In another aspect, the present disclosure relates to locating utilities buried under the sea (e.g. undersea cables and other conductors).

In another aspect, the present disclosure relates to locating buried utilities using one or more locating devices mounted on terrestrial vehicles, submarine vehicles, and/or aerial vehicles.

In another aspect, the present disclosure relates to locating buried utilities using one or more locating devices mounted on completely autonomous, driverless or robotic vehicles.

In another aspect, the present disclosure relates to locating buried utilities using one or more locating devices mounted on a vehicle moving in geographical regions including freeways, highways, and/or busy streets.

In another aspect, the present disclosure relates to locating buried utilities using one or more locating devices mounted on a vehicle moving in large geographical regions in a fast and cost-effective manner.

In another aspect, the present disclosure relates to time-stamping at least a portion of the utility data pertaining to the buried utilities relative to a precise pulse signal, such as 1PPS (pulse per second) synchronization signal provided by a positioning device.

In another aspect, the present disclosure relates to mapping the buried utilities located by one or more locating devices mounted on a vehicle.

In another aspect, the present disclosure relates to providing a map to a user to indicate optimized location of the buried utility.

In another aspect, the present disclosure relates to providing a map to a user to indicate a set of probable locations of the buried utility.

In another aspect, the present disclosure relates to providing a navigational map to a vehicle operator to assist a vehicle operator to follow the path of a buried utility.

In another aspect, the present disclosure relates to providing real-time audio and/or visual feedback or guidance to assist a vehicle operator to return to the path of a buried utility when the vehicle or the operator loses track of the buried utility.

In another aspect, the present disclosure relates to providing a map including a video tour of the geographical region showing location of the buried utility and associated attributes, wherein the virtual tour, in one example, may be compatible to be viewed and/or experienced in a real-world using virtual reality devices.

In another aspect, the disclosure relates to a method for determining gradient tensors from tensor derivatives of a signal's magnetic field vectors.

In another aspect, the present disclosure relates to providing a map including a heat map whereby a hierarchy of gradient and/or gradient tensor values may be represented by color, shading, patterns, and/or other representation of measured gradients at locations within the map.

In another aspect, the present disclosure relates to a system for locating and/or mapping buried utilities, having one or more locating devices mounted on a vehicle and supported thereon by a support assembly, in which the locating devices include, amongst several other components, a processing unit configured to locate utilities buried along or across a path of the vehicle in accordance with a velocity of the vehicle.

In another aspect, the present disclosure relates to a system for locating and/or mapping buried utilities having one or more locating devices mounted on a vehicle and supported thereon by a support assembly, in which the locating devices include, amongst several other components, a processing unit configured to locate utilities buried along or across a path of the vehicle moving at a speed of 3 m/s or more.

In another aspect, the present disclosure relates to a system for locating and/or mapping buried utilities having one or more locating devices mounted on a vehicle moving on a freeway, the locating devices being supported by a support assembly in a fixed orientation relative to the vehicle. The locating devices include, amongst several other components, a processing unit configured to locate utilities buried underneath the freeway.

In another aspect, the present disclosure relates to a system for locating and/or mapping buried utilities having one or more locating devices mounted on a vehicle, where each of the locating devices is configured to simultaneously receive and process a combination of passive radio broadcast signals and active multi-frequency magnetic field signals emitted from a buried utility (e.g., at a similar or different bandwidth) and detect, location of the buried utility based in part on the radio broadcast signals and active multi-frequency magnetic field signals. In one example, the processing of radio broadcast signals includes sampling the broadcast signals, for example, AM frequency signals, at a sampling rate of 32 Hz, and processing multi-frequency magnetic field signals include sampling multi-frequency electromagnetic signals at a sampling rate of 5 Hz-20 Hz. In one aspect, the multi-frequency magnetic field signals and the radio broadcast signals are sampled at a plurality of sampling intervals of a plurality of bandwidth. In an example, the samples or sampled signals may be overlapping in a time domain.

In another aspect, the present disclosure relates to a system for locating and/or mapping buried utilities including a pair of locating devices mounted on a vehicle in a spaced apart relationship, a support assembly for receiving and supporting the locating devices thereon in a fixed orientation relative to the vehicle, and a positioning device operably coupled to each of the locating devices and located centrally from each of the locating devices to process signals or data received from the locating devices, and generate an absolute position of the buried utilities in a relative coordinate system.

In another aspect, the present disclosure relates to a system for mapping and/or locating buried utilities including a plurality of locating devices mounted onto a plurality of vehicles for locating one or more buried utilities when moving along or across path(s) of the buried utilities, and a remote server located remotely from the locating devices and communicatively coupled to the locating devices configured to obtain data pertaining to the buried utilities from such locating devices, which is typically stored in a database associated with the remote server. The remote server includes various modules and/or components configured to process the utility data based on preconfigured algorithms, techniques, rules, and/or parameters, to detect optimized and/or probable locations of the utilities, and generate corresponding maps to display such detected locations, which may be provided to corresponding users on their electronic devices.

According to different aspects, the remote server may be configured to post-process the utility data, or process the utility data in real-time or near real time. The remote server, in one example, is a computer system arranged to support a user interface, wherein a user can request a location of the buried utility through the electronic user interface, where the location may be overlaid on a map of a geographical region, or a navigation application for display to the user.

In another aspect, the present disclosure relates to a method for locating and/or mapping buried utilities comprising obtaining, by a locating device mounted on a vehicle, utility data pertaining to a buried utility, detecting location of the buried utility based in part on the utility data, and transmitting the location of the buried utility to an electronic device associated with the vehicle on which the detected location of the buried utility is overlaid on a map of a geographical region. Such location and map may be continuously updated as the vehicle moves over or across the path of the buried utilities.

In another aspect, the present disclosure relates to a method for locating and/or mapping buried utilities comprising obtaining, by each of a pair of locating devices mounted on a vehicle, utility data pertaining to a buried utility, and transmitting the utility data to a positioning device coupled to each of the locating devices wirelessly or by other suitable means. The method further includes detecting, at the positioning device, location of the buried utility based on processing the utility data obtained from each of the locating devices, and transmitting, the detected location of the buried utility to an electronic device associated with the moving vehicle on which the detected location of the buried utility is overlaid on a map of a geographical region for display to a user, say, a vehicle operator. The method further includes generating and updating the displayed location, in real-time, as the vehicle moves over or across the path of the buried utilities.

In another aspect, the present disclosure relates to a system for locating and/or mapping buried utilities. The system comprises a locating device coupled to a positioning device supplying a precise pulse synchronization signal to the locating device. The locating device are mounted on a vehicle to collect utility data pertaining to a buried utility upon sensing the buried utility while moving along or across a path of the buried utility. The locating device include a processing unit configured to timestamp at least a portion of the collected utility data relative to the precise pulse synchronization signal obtained from the positioning device. In an example, the positioning device may be a Global Positioning System (GPS), and the precise pulse synchronization signal may be one pulse per second (1PPS) signal obtained from the GPS.

In another aspect, the present disclosure relates to a system for locating and/or mapping buried utilities may include a first locating device mounted on a vehicle. The first locating device may include a first processing unit configured to collect utility data pertaining to a buried utility at a first set of location data points. The first processing unit may include a first slave clock to synchronize to a master clock to timestamp the collected utility data collected in accordance with the first slave clock. The system may further include a second locating device mounted on the vehicle. The second locating device may include a second processing unit configured to collect utility data pertaining to a buried utility at a second set of location data points. The second processing unit may include a second slave clock to synchronize to the master clock to timestamp the collected utility data in accordance with the second slave clock. Furthermore, the system may include a positioning device coupled to the first locating device and the second locating device. The positioning device may include the master clock. The positioning device may be configured to correlate the timestamped utility data collected at the first set of location data points and the second set of location data points in a time domain to detect and trace a location of the buried utility within the geographical region.

In another aspect, the present disclosure relates to a method for locating and/or mapping buried utilities. The method may include obtaining, by a remote server, utility data pertaining to a buried utility from a plurality of locating devices mounted on a plurality of vehicles, and storing the utility data in a database associated with the remote server, and dynamically detecting, based in part on the combined utility data stored in the database, location of the buried utility. The method may further include receiving a user request for navigating through the buried utility on a map, and mapping, based on the user request, the detected location of the buried utility on the map for display to the user on an electronic device, wherein the displayed location is, dynamically, updated based in part on a subsequent change to the utility data stored in the database. The location may be dynamically updated till navigation is active on the electronic device.

In another aspect, the present disclosure relates to a method for mapping buried utilities comprising obtaining, by a remote server, aggregated utility data pertaining to a buried utility collected by a plurality of locating devices mounted onto a plurality of vehicles along a path of the buried utility, detecting, based in part on the aggregated utility data, an optimized location of the buried utility, and subsequently generating a map indicative of the optimized location of the buried utility, which may be displayed on electronic devices associated with respective vehicles. The method, in yet another aspect, may be performed in real-time or near-real time as vehicle moves over the path of the buried utilities.

In another aspect, the present disclosure relates to a method for mapping buried utilities comprising obtaining, by a remote server, aggregated utility data pertaining to a buried utility collected by a plurality of locating devices mounted onto a plurality of vehicles moving along or across a path of the buried utility, detecting, based in part on the aggregated utility data, an optimized location of the buried utility, and subsequently generating a map indicative of the optimized location of the buried utility, which may be displayed on electronic devices associated with respective vehicles. Such a method, in yet another aspect, may be performed in real-time or near-real time as vehicle moves over the path of the buried utilities.

In another aspect, the present disclosure relates to a method for mapping buried utilities comprising obtaining, by a remote system, aggregated utility data pertaining to a buried utility collected by a plurality of locating devices mounted onto a plurality of vehicles moving along or across a path of the buried utility, ascertaining a set of locations (e.g. in form of location data points) for the buried utility based on the aggregated utility data, evaluating probability scores for the set of locations, and generating a map depicting a probability contour indicative of probable locations of the buried utility with associated probability scores.

Exemplary Embodiments

FIG. 1A illustrates an embodiment of a system for locating and/or mapping one or more buried utilities using vehicle-mounted locating devices, embodying the principles and concepts of the present disclosure.

As shown in the FIG. 1A, the system 100 may include one or more locating devices 102 mounted on a vehicle 104 for locating one or more buried utilities 106 while moving along and/or crossing a general path of one or more buried utilities 106. The locating devices 102 referred to herein may be the ones described in one or more of the previously mentioned co-assigned applications that have been incorporated by reference in the instant application configured to locate buried utilities at a moving speed of the vehicle 104 which, in a typical example, may be 3 m/s or more, and in another example, may be in a range of about 4-20 m/s, thereby facilitating detection of utilities in large geographical regions spanning across multiple areas and/or cities including freeways, highways, busy streets or the like, precisely and quickly.

The vehicle 104 on which the locating devices 102 may be mounted includes any kind of a motor assisted user-propelled vehicle (e.g. motor vehicles driven by an operator) or a self-propelled vehicle (e.g. autonomous, driverless, or robotic vehicles), capable of supporting the locating devices 102 thereon. Some examples may include terrestrial vehicles, submarine vehicles, aerial vehicles, or a combination thereof, including, but not limited to, cars, trucks, sport utility vehicles (SUVs), motorcycle, boat, ship, drone aircraft, pushcarts, bicycles, and tricycles or the like. Further, the vehicle 104 may be a high-speed vehicle moving at a speed of more than 10 m/s. Although embodiments described hereinafter in the description and appended drawings refer to locating devices 102 being mounted on, particularly, terrestrial vehicles, this description and/or drawings are not intended to be construed in a limiting sense. Various other embodiments with the locating devices 102 being mounted on other types of vehicles including aerial vehicles and submarine vehicles (e.g., to detect utilities buried under the water) are deemed to lie within the principle and scope of the invention.

The locating devices 102 may be mounted on one or more of the aforementioned vehicles, such as the vehicle 104 using a support assembly 108. The support assembly 108 may be made of either partially, largely, or entirely of a non-metallic and/or non-electrically conductive material.

The support assembly 108 may further support one or more positioning devices 110 such as a high precision global position system (GPS) antenna, Global Navigation Satellite System (GNSS) antenna, or the like, which in this embodiment, may be located centrally on the support assembly, and is/are operably coupled to the locating devices 102. The positioning device(s) 110 may, in other embodiments, be attached directly to the locating devices 102, or may be integrated into the locating devices 102. The positioning device(s) 110 may convert position of the buried utility 106 as detected by the locating devices 102 into an absolute position capable of being represented in a geographical coordinate system (e.g. latitude and longitude).

Figure 1B:
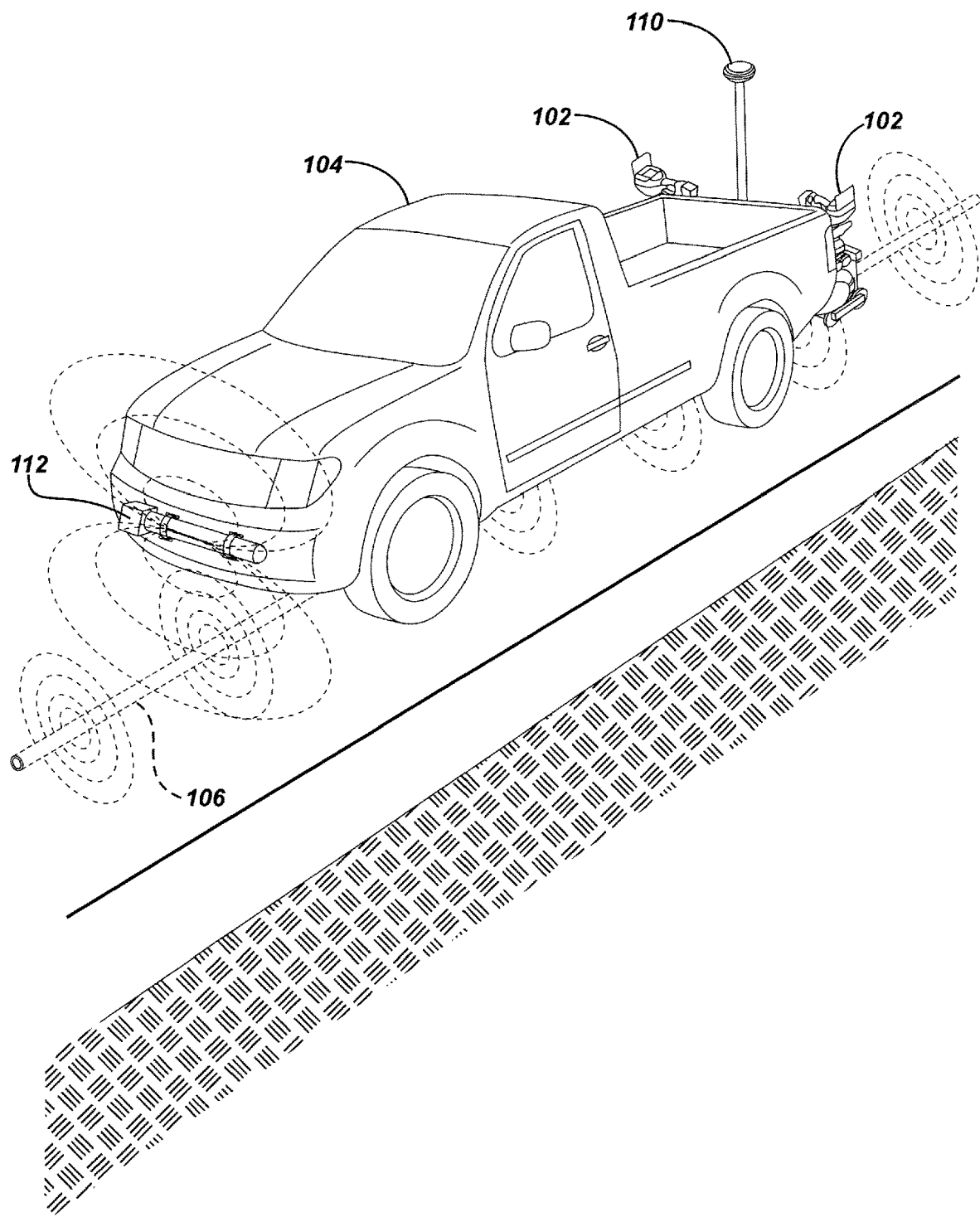

The system 100 may further include an inductive coupling device(s) 112 mounted on the vehicle 104, as shown in the FIG. 1B, for inducing current into the buried utilities 106 (e.g., along a length of the buried utilities 106). The inductive coupling device 112 may be mounted in an opposite direction of the locating devices 102 using a suitable mounting arrangement, to prevent signal clipping on the locating devices 102. For example, if the locating devices 102 are mounted at a rear portion of the vehicle 104, the inductive coupling device 112 may be mounted at a front portion of the vehicle 104, and vice versa.

In an embodiment, the support assembly 108 may support the locating devices 102 and the positioning device(s) 110 in a fixed orientation on the vehicle 104. A specific mounting arrangement may, however, vary depending upon various factors including the number of locating devices 102 to be supported and type of the vehicle 104. For example, in some aspects, one locating device 102 and a positioning device 110 may be mounted on a vehicle 104, and in other aspects, more than one locating device 102 and the positioning device 110 may be mounted on a vehicle 104, for locating buried utilities 106, in several possible mounting arrangements, some of which are shown in the FIGS. 2A-2E.

Figure 2A:
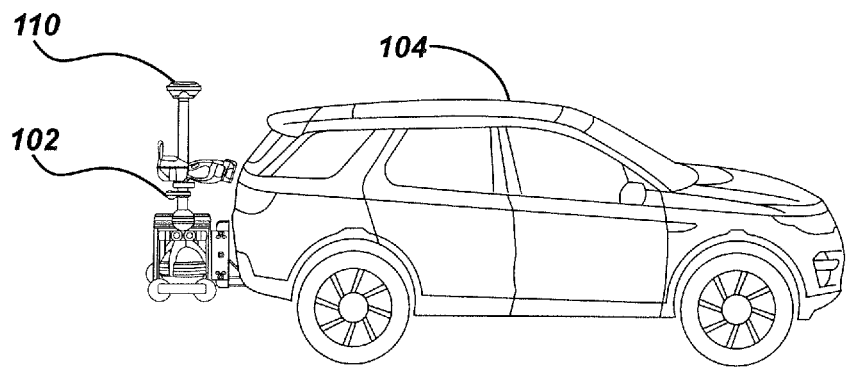
FIGS. 2A-2E illustrate exemplary arrangements for mounting the locating devices on the vehicle.
Figure 2B:
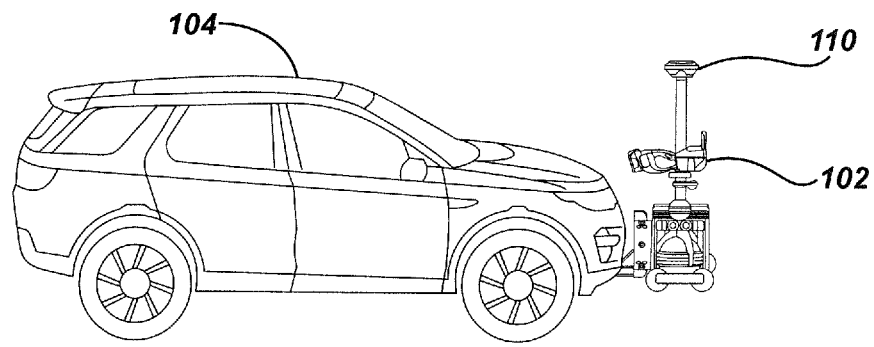
Figure 2C:
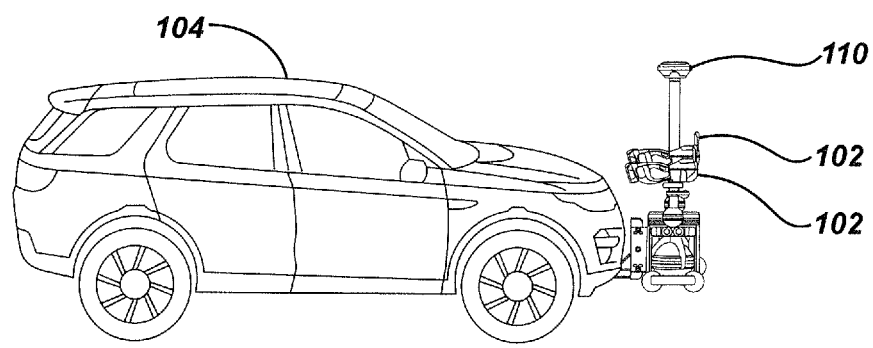
Figure 2D:
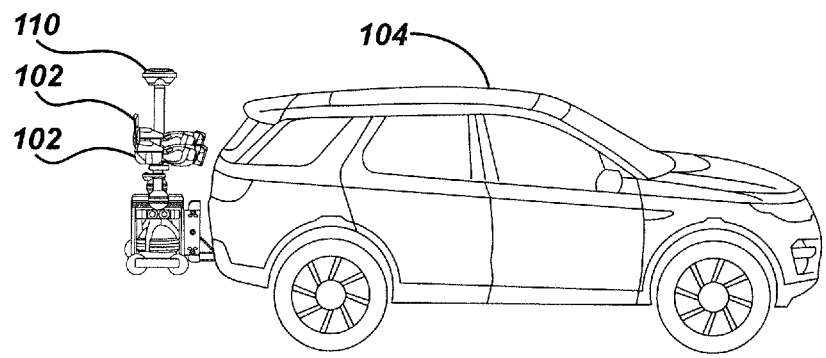
Figure 2E:
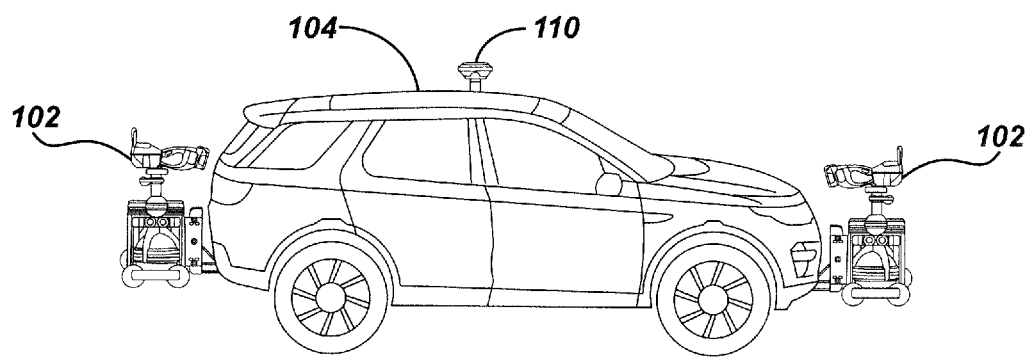

As shown in the FIG. 2A, a locating device 102 and a positioning device 110 may be mounted at a rear portion of a vehicle 104. In the FIG. 2B, the locating device 102 and a positioning device 110 may be mounted at the front portion of the vehicle 104. In FIG. 2C, a pair of locating devices 102 and a positioning device 110 may be mounted at the front portion of the vehicle 104. In FIG. 2D, a pair of locating devices 102 and a positioning device 110 may be mounted at the rear portion of the vehicle 104. In FIG. 2E, a pair of locating devices 102 with one mounted at a front portion and one mounted at a rear portion may be provided with positioning device 110 mounted on a roof of the vehicle 104. These examples may additionally include an inductive coupling device 112 mounted on the vehicle 104 at a suitable position.

Although the description, in the instant application, mostly refers to an embodiment where a pair of locating devices 102 and a positioning device 110 are mounted on a rear portion of the vehicle 104, for example, at a tailgate hitch receiver, and an inductive coupling device 112 mounted at a front portion of the vehicle 104, this specific embodiment should not be construed in a limiting sense. Any number of locating devices 102 either alone or in combination with one or more separately mounted or integrated positioning devices, and/or inductive coupling device(s) having similar or different mounting arrangements on the vehicle 104 such as those illustrated in the FIGS. 2A through 2E and other possible arrangements are within the scope of the present disclosure.

Figure 3A:
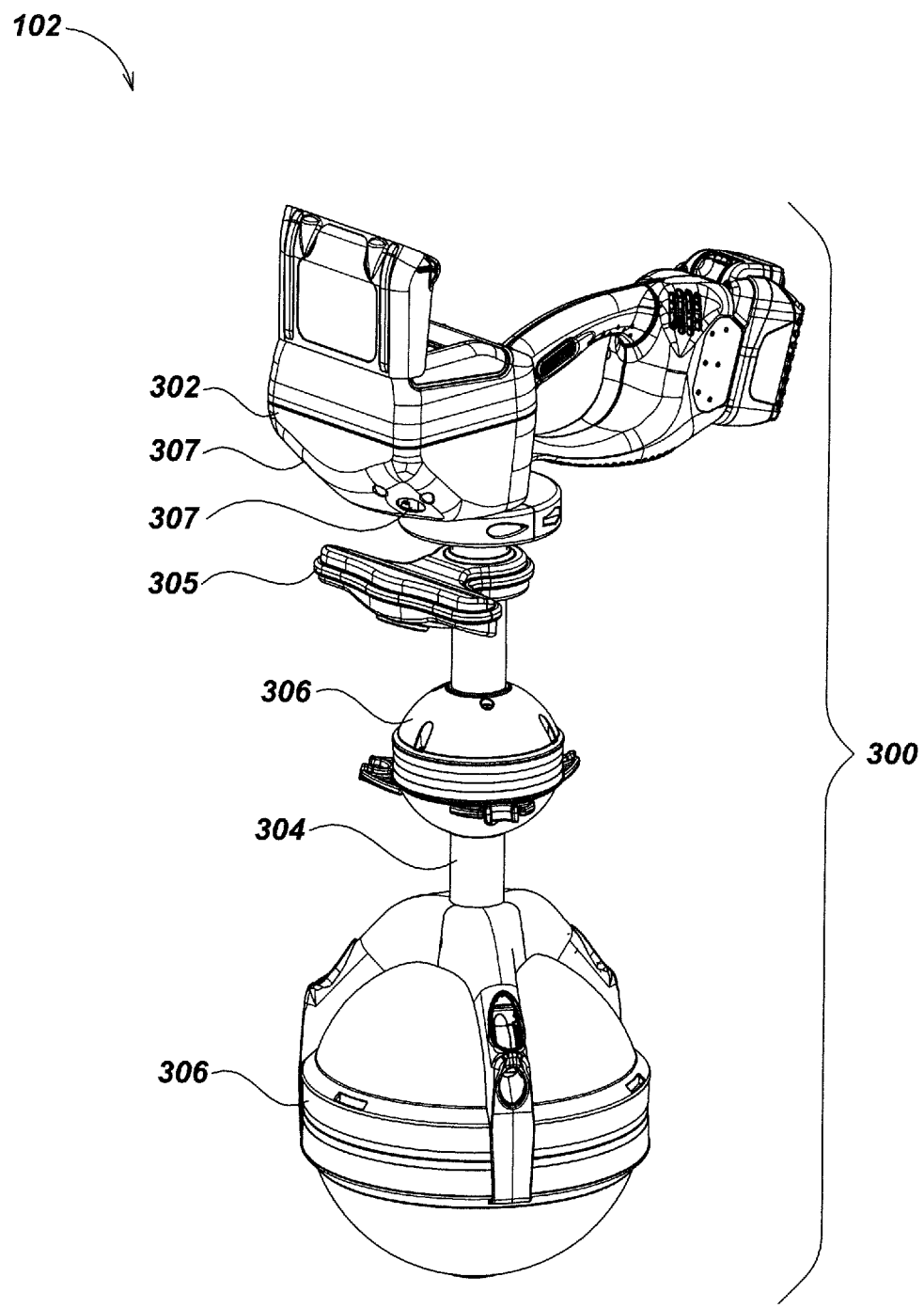
FIGS. 3A-3C illustrate embodiments of components of the locating device.
Figure 3B:
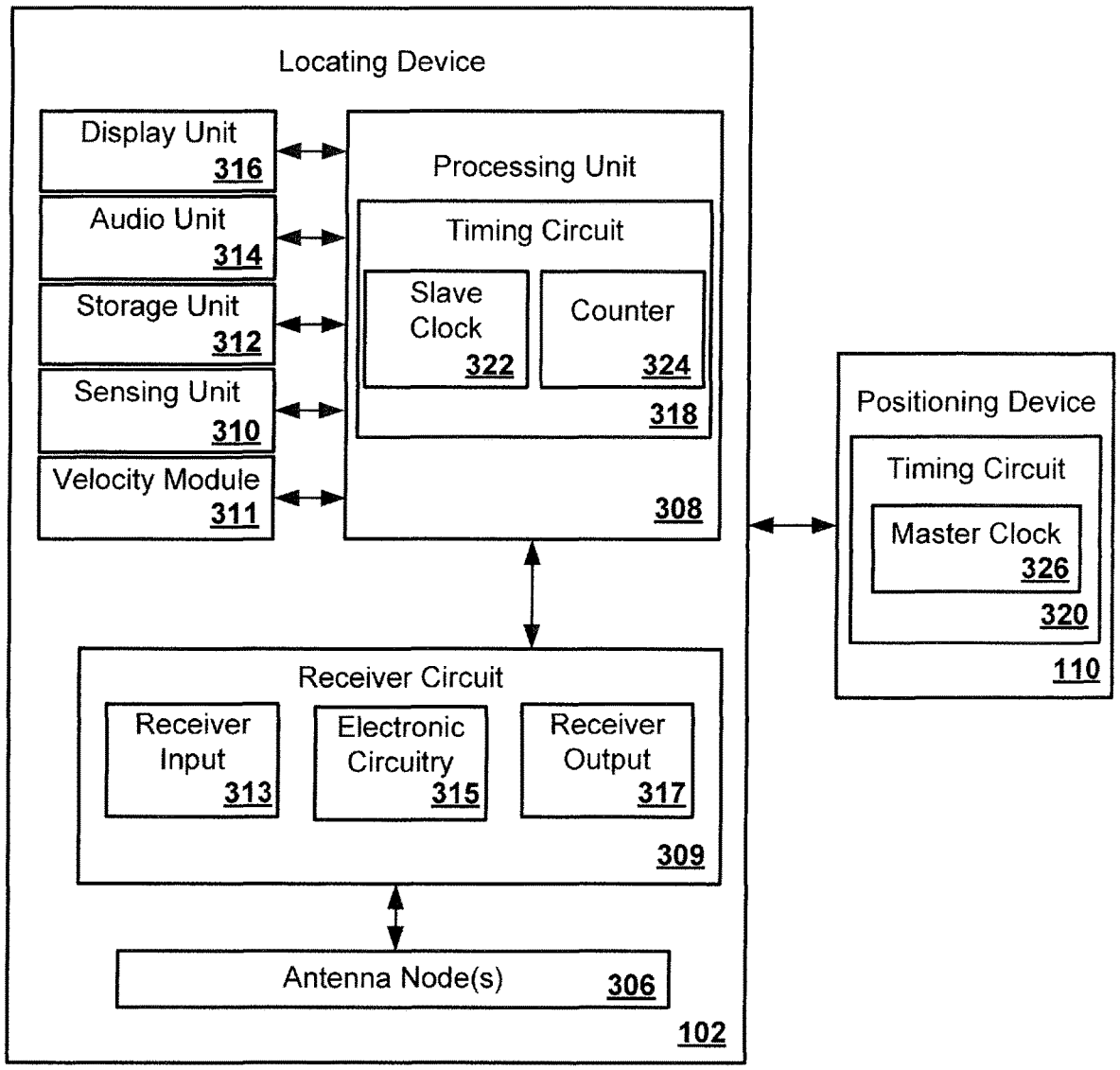
Figure 3C:
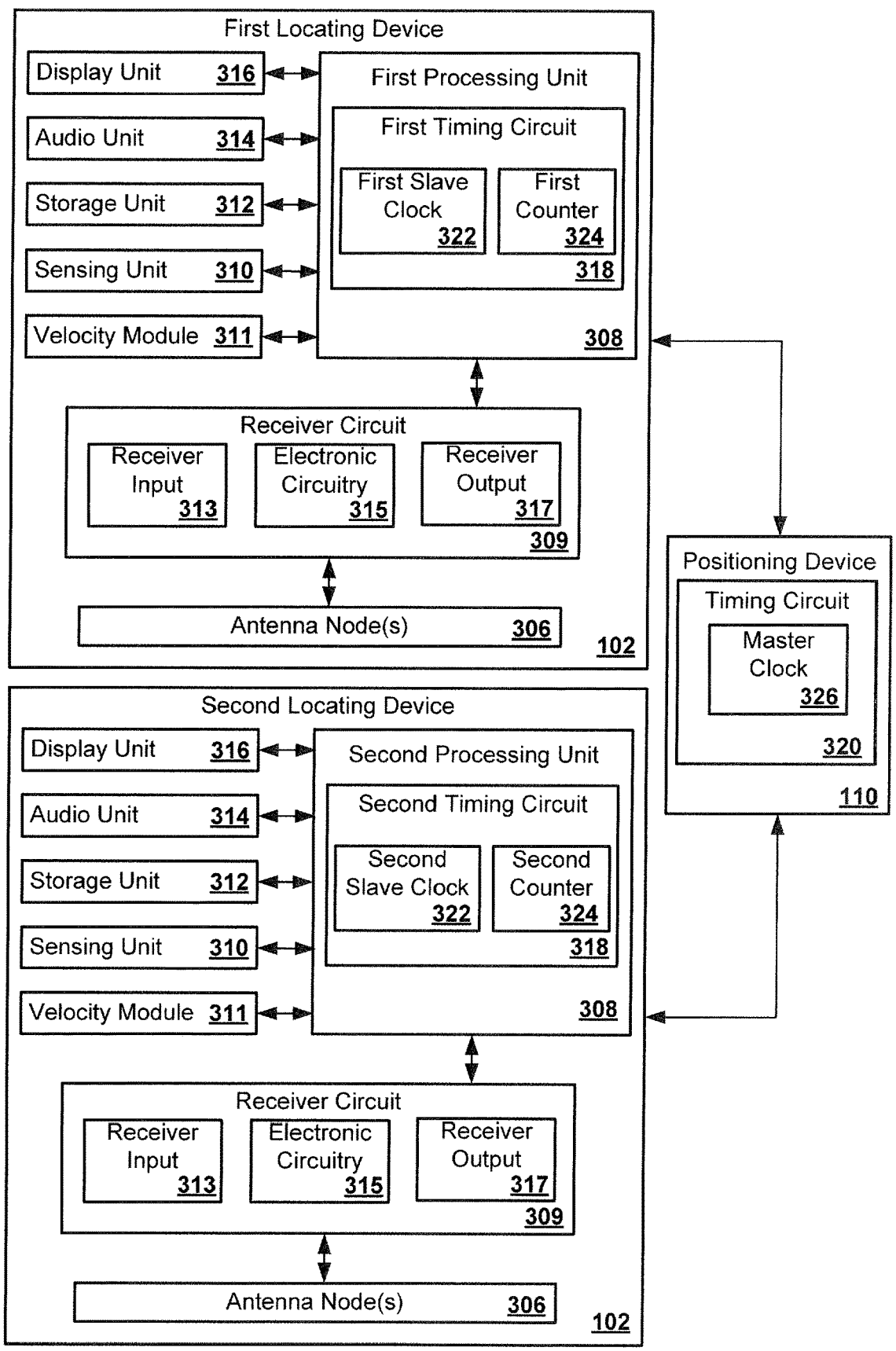

FIGS. 3A-3C illustrate an exemplary locating device 102 and its associated components/elements/modules of a locating device 102. These components/elements/modules, however, are not exhaustively listed or described for the sake of brevity. Additional details on these components and/or additional components of the locating device may be referred from one or more of the "co-assigned applications" which have been incorporated by reference in the instant application.

As shown in the FIG. 3A, the locating device 102 may include a body 300 which may be configured differently. The body 300 may include a head unit 302, and a central mast 304, along with associated mechanical components, such as hardware, connectors, etc. The locating device 102 may further include one or more antenna modules or nodes 306, which may be of the same or similar forms, and may be molded to be coupled around the central mast 304, or disposed on or within the body 300 in various configurations.

The antenna nodes 306 may include an antenna configuration of multiple coils. The antenna nodes 306 may each include a node housing and an antenna assembly. The antenna assembly may include an antenna array support structure, an interior omnidirectional antenna array disposed on the antenna array support structure, and supplementary antennas and/or sensors. One or more of the antenna nodes 306 may be a dodecahedral antenna node. Alternately, or in addition, one or more of the antenna nodes 306 may be a gradient antenna node. The gradient antenna node may include a plurality of orthogonally arranged antenna coils and a pair of gradient antenna coils.

The head unit 302 of the locating device 102 may contain analog and/or digital electronic circuitry to receive and process signals from antennas and other inputs, such as audio inputs, camera signals, and the like. Head unit 302 may include display, control and/or user interface components, such as one or more visual displays, speakers and/or headphone interfaces, switches, touchscreen elements, one or more camera elements, and the like. In one aspect, the camera elements may include a pair of outward cameras 307 projecting downwardly to record imagery of the ground (locate area) where utilities are buried.

The electronic circuitry may include one or more processing units, which refers to a device or apparatus configured to carry out programmable steps and/or other functions associated with the methods described herein by processing instructions, typically in the form of coded or interpreted software instructions. For instance, a processing unit as described may be a general purpose processor, a digital signal processor (DSP), an application specific integrated circuit (ASIC), a field programmable gate array (FPGA) or other programmable logic device, discrete gate or transistor logic, discrete hardware components, memory elements, or any combination(s) thereof designed to control various locator functions, such as those described subsequently herein.

The electronic circuitry may further include a plurality of sensing units including, but not limited to, motion sensors, such as accelerometers, gyroscopes, magnetometers, altimeters, other inertial sensors, temperature sensors, humidity sensors, light sensors, barometers, sound, gas, radiation sensors, and the like. The electronic circuitry may further include Bluetooth radios, Wi-Fi, and/or other wireless communication devices, cameras and/or other imaging sensors, audio sensors or recorders, global positioning satellite (GPS) sensors, global navigation satellite system (GNSS), or other satellite navigation sensors incorporated therein.

The locating device 102 may further include a ground tracking device 305 coupled to the central mast 304 for tracking positions, such as translational and rotational movements, of the locating device 102 with respect to the ground. The ground tracking device 305 may be a stereo optical ground tracking device having one or more imagers for tracking ground features of the utility path which may be utilized to track the positions of the locating device 102. For example, the ground features may be correlated in time to determine height of the locating device 102 from the ground surface and various other measurements. Further, the ground features may be correlated in time to calculate motion vectors facilitating precise determination of translational movements and rotations of the locating device 102. In one example, the determined height, translational movements and rotations, may be used to determine depth and orientation of the buried utility.

An exemplary block diagram of the locating device 102 may be seen in FIG. 3B. As shown, the locating device 102 may include one or more antenna nodes 306, a receiver circuit 309 coupled to the antenna nodes 306, one or more processing units 308 coupled to receiver circuit 309, a velocity module 311 coupled to the processing unit 308, a plurality of sensing units 310 also coupled to the processing units 308, a storage unit 312 that may be an internal memory or an external memory (e.g. a USB) coupled to the processing units 308, an audio unit 314 coupled to the processing units 308, and a display unit 316 also coupled to the processing units 308.

The processing units 308 may include a user interface (UI) processor (not shown) coupled to the audio unit 314 and the display unit 316, a data processor (not shown) coupled to the UI processor and the storage unit 312 (e.g. a USB), a motion processor (not shown) having sensing units 310 coupled to the data processor, and a field-programmable gate array (FGPA, not shown) having associated digital filter(s), such as Discrete Fourier Transform (DFT) filter(s) coupled to the data processor and the antenna nodes 306.

The antenna nodes 306 may receive magnetic fields signals including active magnetic field signals directly associated with the buried utility 106, and passive magnetic field signals (e.g., broadcast signals radiated from a radio broadcast station, such as AM radio station), which when encountering a portion of a buried utility 106, induces a current in the buried utility 106 that generates an electromagnetic field around the buried utility 106.

In an embodiment, the antenna nodes 306 may sense magnetic fields (e.g., active and passive magnetic fields signals) emitted from buried utilities 106 at different frequencies and/or different bandwidth and provide antenna output signals corresponding to the sensed magnetic fields to the receiver circuit 309. The receiver circuit 309 may include a receiver input 313 to receive the output signals, an electronic circuitry 315 to process the received output signals, and a receiver output 317 to provide the receiver output signals corresponding to the received magnetic fields.

The processing unit 308 receives these receiver output signals, and may further receiver a velocity information pertaining to the vehicle having the locating device(s) 102 coupled thereto, from a velocity module, to process the receiver output signals (e.g., utility data) in conjunction with the vehicle's velocity information to detect location of the buried utility 106 along with an estimated depth and orientation of the buried utility 106, which may be logged into the storage unit 312.

The processing unit 308 may further receive sensor data from the sensing units 310 and/or ground tracking device(s) 305 and process the receiver output signals (utility data) in conjunction with the sensor data and ground tracking data (e.g., recorded imagery obtained from the camera elements 307), to detect position(s), depth and orientation of the buried utility 106.

In an embodiment, the processing units 308 may include associated timing circuits 318 to register a timestamp for one or more events occurring at respective processing units 308. Each of the timing circuits 318 may be synchronized with a timing circuit 320 of a positioning device 110, which is operably coupled to the locating device 102. The timing circuits 318 may include respective slave clocks 322, and associated counters 324, which may be adjusted in accordance with a master clock 326 associated with a timing circuit 320 of the positioning device 110. The master clock 326 may be operating according to a UTC (Coordinated Universal Time).

The positioning device 110, in an embodiment, may supply a precise pulse, for example, 1 pulse per second (1PPS) synchronization signal to each of the processing units 308. Upon receiving this precise pulse synchronization signal, the slave clocks 322 associated with respective processing unit 308 may each synchronized with the master clock 326 associated with the positioning device 110, and the associated counters 318 may be reset. The processing units 308 may then utilize their synchronized slave clocks 322 to register a timestamp with one or more events occurring at the respective processing units 308.

The timestamp, as referred herein, may include a calendar date and a time registered with a predefined degree of accuracy, say, accuracy to second, millisecond, and nanosecond.

The events occurring at the processing units 308 may be understood as execution of a particular step or a part of the step of the method described in the instant application, at the processing units, and/or a general functional step executed at a processing unit. For instance, an exemplary event at one of the processing units 308 may be detection of location of the buried utility 106 (referred to as a location data point) within a geographical region, where the location data point corresponds to a particular location instance of a buried utility line in the geographical region. As the vehicle 104 moves along the path of the buried utility 106, the subsequent events may include detection of further location data points within the geographical region. These location data points when combined may be used for tracing the location of the buried utility 106 within the geographical location. Other exemplary events may include collection of the utility data, processing of sensor data, and the like.

In the context of the present subject matter, the events occurring at any of the processing units 308 may either directly or indirectly pertains to one or more buried utilities 106. Consequently, data generated upon occurrence of such events pertains to the utility data. This utility data, or at least a portion of this utility data, may be timestamped at the respective processing units 308 relative to the precise pulse (e.g. 1PPS) synchronization signal received from the positioning device 110. The timestamped utility data may thereafter be processed in a time domain to detect and trace the location of the buried utility and its corresponding depth and orientation.

FIG. 3C illustrates an embodiment where a pair of locating devices may be mounted on a vehicle. As shown in the FIG. 3C, the first locating device 102 may include at least a first processing unit 308 having, amongst several other components, a first slave clock 322 and a first counter 324, Likewise, the second locating device 102 may include at least a second processing unit 308 having, amongst several other components, a second slave clock 322, and a second counter 324.

In this embodiment, the first processing unit 308 and the second processing unit 308 may synchronize their respective first slave clock 322 and the second slave clock 322, with a master clock 326 associated with the positioning device 110 supplying a precise pulse (e.g. 1PPS) synchronization signal. Further, the first processing unit 308 and the second processing unit 308 may reset their respective first counter 324 and the second counter 324 upon receiving the precise pulse signal. The first counter 324 and the second counter 324 may be running at a different speed, however, these may be hit and reset by the precise pulse signal at the same time upon receiving the precise pulse signal.

In operation, the first processing unit 308 may collect utility data pertaining to a buried utility 106 at a first set of location data points within a geographical region, and timestamp the utility data collected at each of the first location data points in accordance with the first slave clock 322, which is synchronized to the master clock 326 operating in accordance with a UTC (Coordinated Universal Time).

The second processing unit 308 may collect utility data pertaining to the buried utility 106 at a second set of location data points within a geographical region, and timestamp the utility data collected at each of the second location data points in accordance with the second slave clock 322, which is synchronized to the master clock 326.

The timestamped data, thus, obtained at the set of first location data points and the second location data points may be processed in a time domain at the positioning device 110 or a remote system, to detect and trace the location of the buried utility 106, and its corresponding depth and orientation.

An exemplary supporting assembly 108 and its associated components supporting the locating devices 102 on the vehicle, is now described with reference to the FIGS. 4A-4I.

Figure 4A:
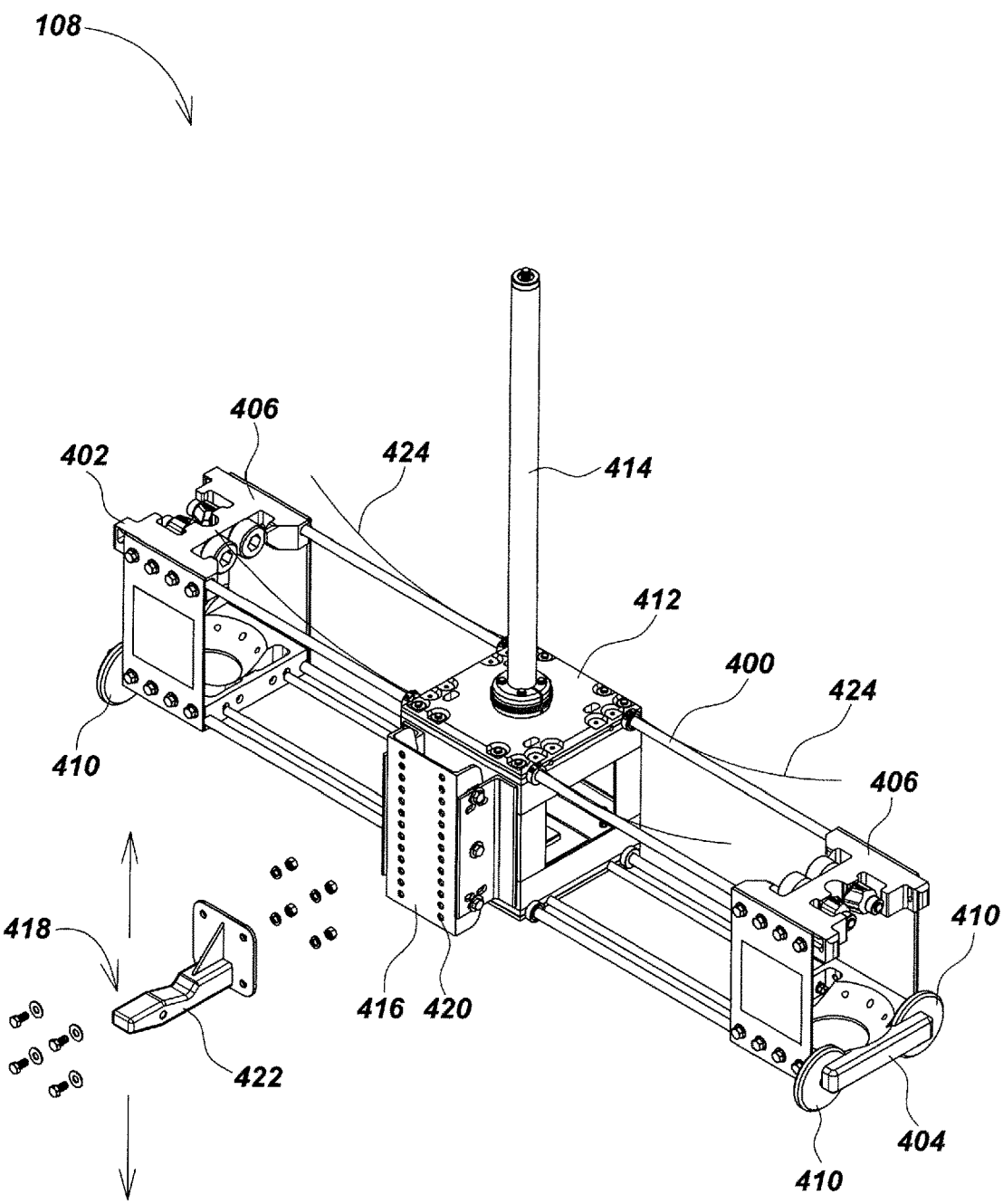
FIGS. 4A-4I illustrate embodiments of a support assembly for supporting the locating device(s) on the vehicle, and associated components of the support assembly.

As shown in the FIG. 4A, the support assembly 108 may include an elongated frame 400 extending transversely to a hitch receiver of a vehicle 104 in a mounted state. This elongated frame 400 may be made of fiberglass rods facilitating the support assembly 108 to flex (as shown by dashed lines 424) upon accidently hitting the ground to prevent any damage thereof The elongated frame 400 may include a first end 402 having a locator mounting assembly 406 and a second end 404 having a locator mounting assembly 406, each provided for receiving and securing a locating device 102 in a fixed orientation thereof using a suitable fastening mechanism, for example, clamps, or the like. Each of the locator mounting assemblies 406 may be provided with wheels 410 that normally rest above ground level and only touch the ground if the vehicle encounters a speed bump or other roadway irregularities for preventing direct contact with the ground at a speed that may otherwise lead to damage of the locating devices 102 and other associated components supported thereon.

Located in between the two locator mounting assemblies 406 may be a central mounting assembly 412 fixedly mounted on the elongated frame 400 at an equal distance from each of the locator mounting assemblies 406. The central mounting assembly 412 may include an elongated mast 414 projecting outwardly therefrom to support a positioning device 110 thereon such that positioning device 110 is positioned centrally from each of the locating devices 102 secured by the corresponding locator mounting assemblies 406. The central mounting assembly 412 may include an elongated plate 416 with its front end facing towards the vehicle 104 for detachably mounting thereto a hitch base 418 being adapted to be fastenably received by a hitch receiver on the vehicle 104.

A plurality of holes/apertures 420 may be provided on the surface of the elongated plate 416 allowing the hitch base 418 to be suitably and detachably mounted into different sets of holes 420 depending upon a desirable vertical height of the support assembly 108 over the vehicle 104. The holes 420 provide flexibility of vertical adjustment or readjustment of the support assembly 108. For example, the hitch base 418 may be fastened to lowermost holes 420 for achieving maximum height or to the uppermost holes for achieving minimum height of the support assembly 108 thereon. Such an adjustment may be made, for example, based on the type of vehicle 104.

In one embodiment, an automated or semi-automated height adjustment of the support assembly 104 may be achieved based on implementing a hydraulic mechanism (not shown), which may be activated/deactivated manually via a control panel mounted inside the vehicle 104, or automatically based on one or more sensing and/or imaging devices deployed in the locating device 102 for measuring a distance from a ground surface to selectively activate or deactivate the hydraulic mechanism for vertically adjusting the support assembly 108, to maintain a predefined level gap from a ground surface. Therefore, the support assembly 108 may easily be adjusted for rough road conditions.

The support assembly 108 may further have a collapsible arrangement and/or components (not shown) enabling the support assembly 108 to collapse and/or be slidably stowed beneath the vehicle 104, or extendably on top of the vehicle 104 when not in use, or when vehicle 104 is required to be parked at a location where the parking space is limited. The stowed support assembly 108 may be readily extended into a use state, when required. The support assembly may further include one or more security and/or theft prevention mechanisms with associated components (not shown), such as security locks, alarms, and the like, to secure locating devices 102, positioning devices 110, and/or other system components and/or devices mounted thereof.

In one aspect, the hitch base 418 may include an elongated arm 422 in order to arrange the support assembly 108, in particular, the locating devices 102 away from body of the vehicle 104 to minimize or eliminate any magnetic distortion or electromagnetic field distortions thereof. Such an elongated arm 422 may be a hydraulic arm operable to adjust relative distance of the support assembly 108 from the vehicle 104.

Figure 4B:
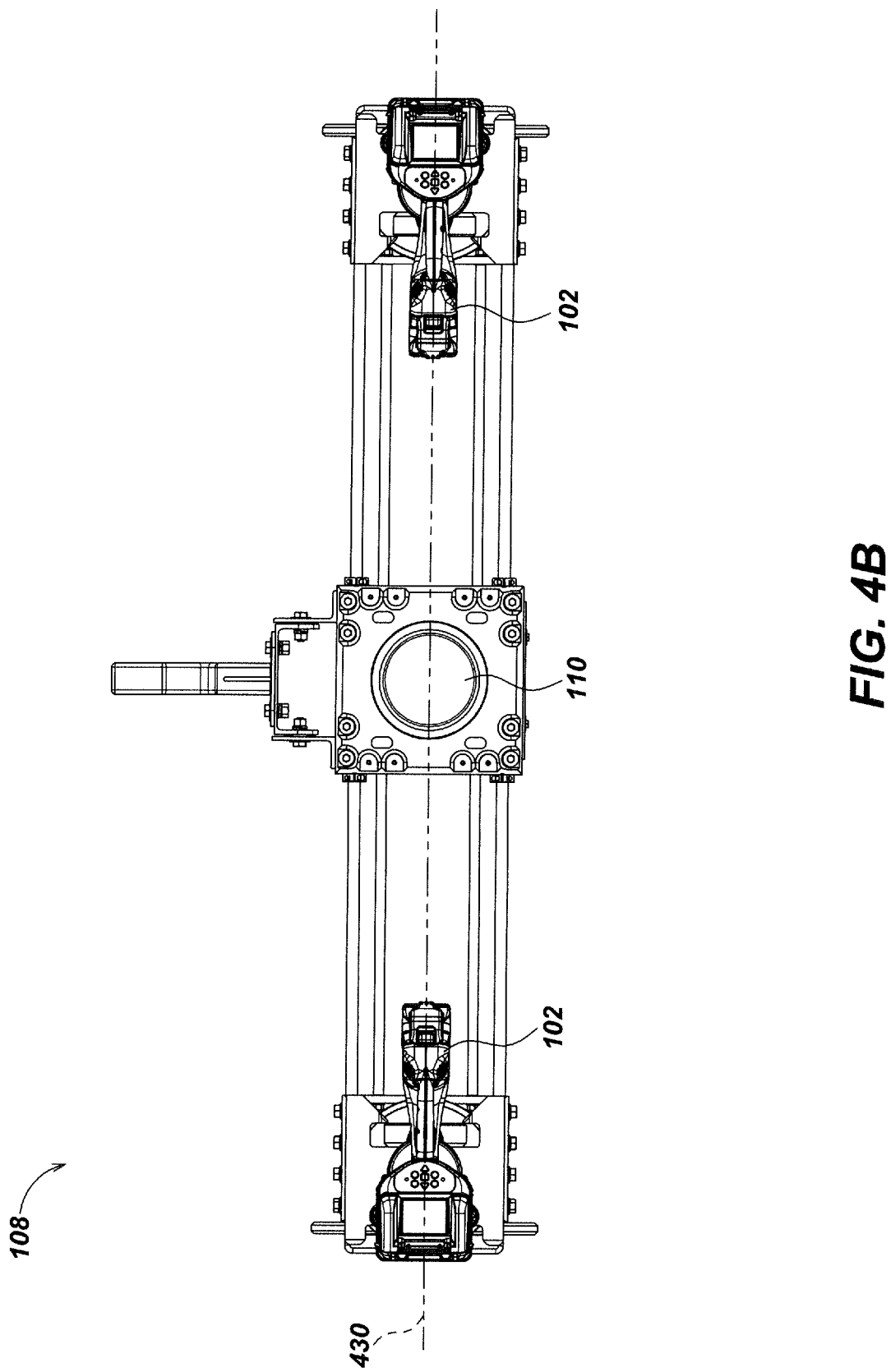
Figure 4C:
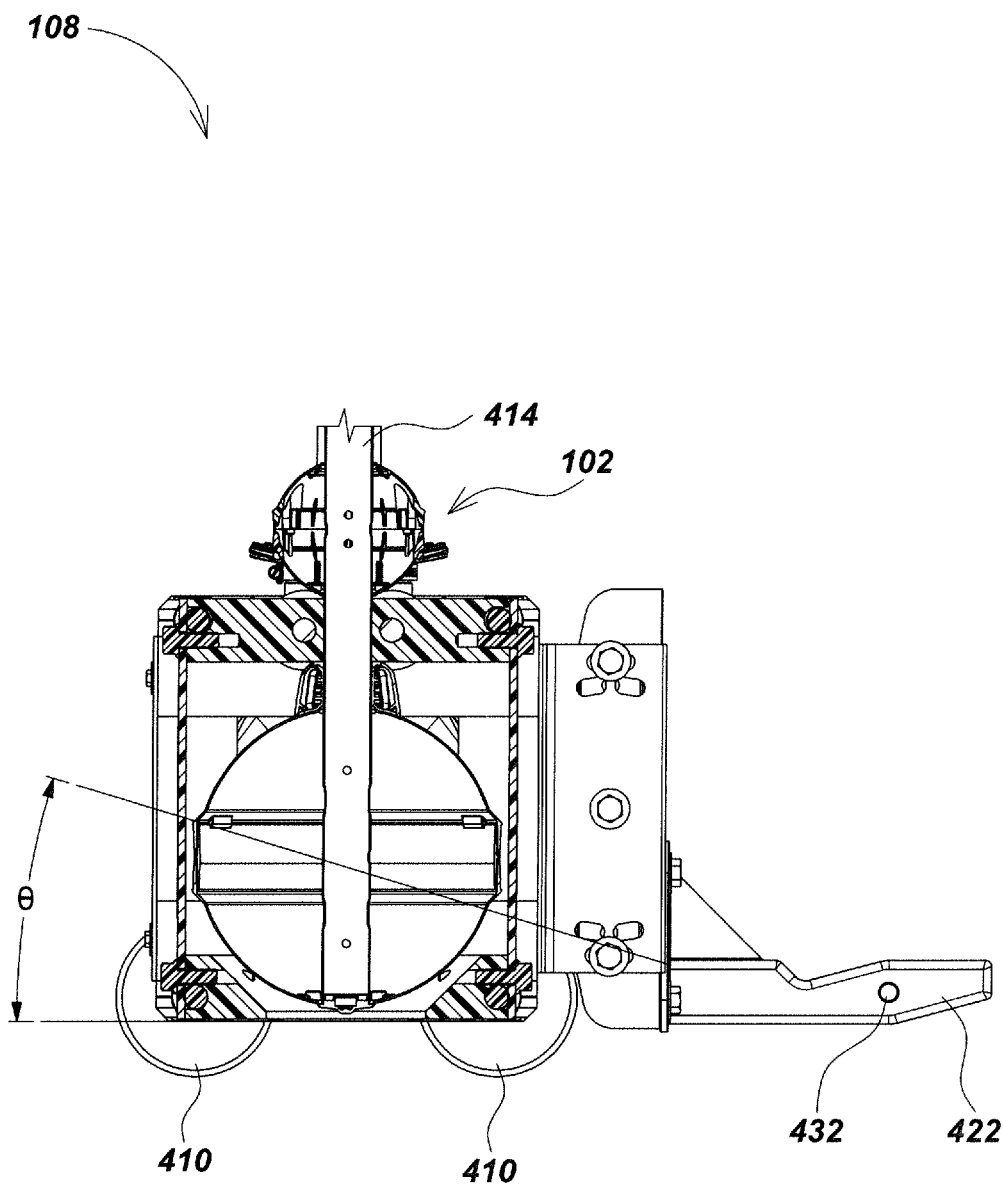
Figure 4D:
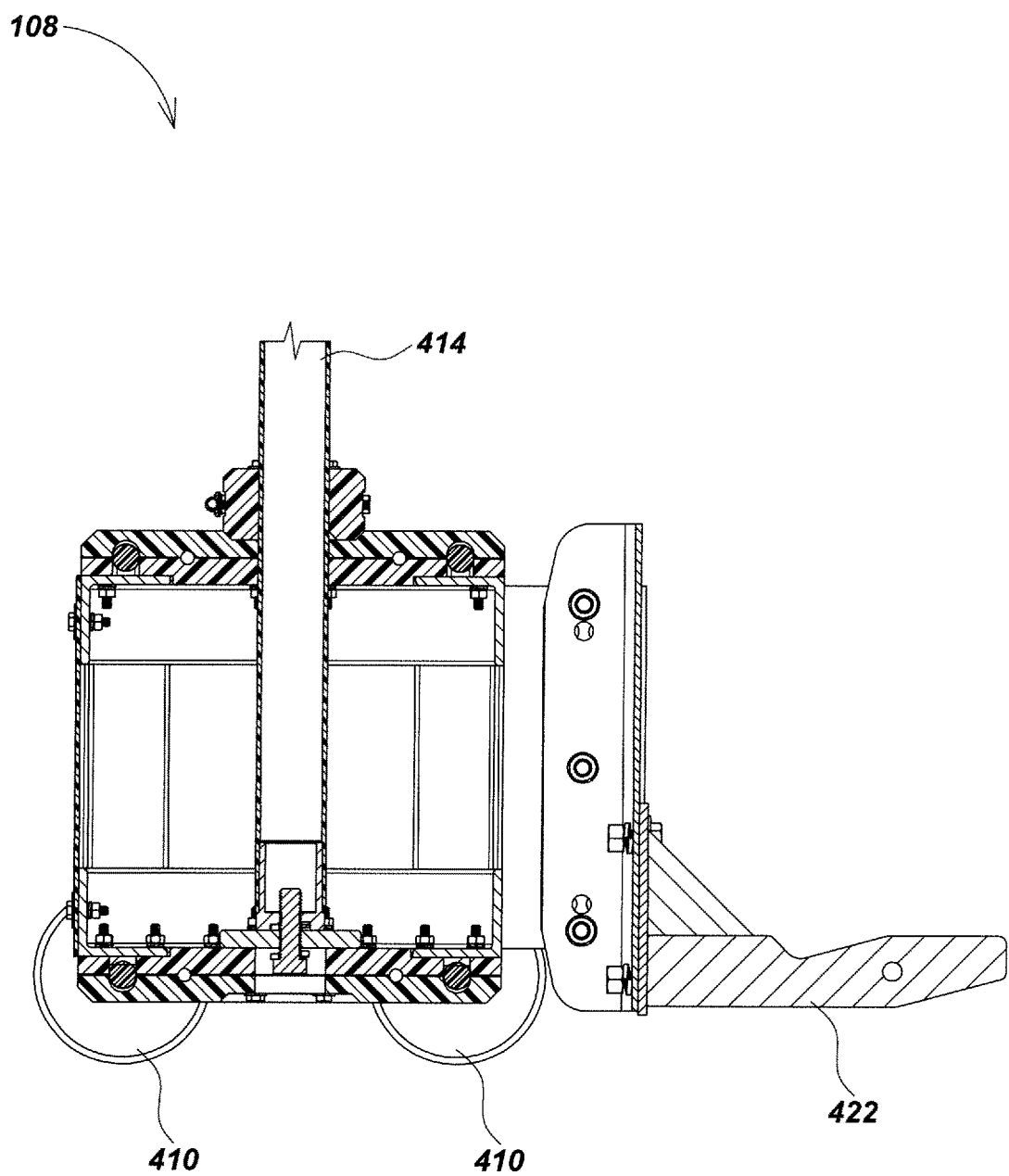

Other aspects and/or views of the support assembly 108 may be seen in FIG. 4B, which illustrates a front view of the support assembly 108 having the locating devices 102 and the positioning device 110 mounted thereon, wherein the locating devices 102 and the positioning device 110 are collinear on an X-plane 430, and FIG. 4C which illustrates a sectional view of the support assembly 108 through a central mounting assembly 412 and the elongated mast 414 supporting the positioning device 110 thereon. As shown in the FIG. 4C, the support assembly 108 may be tiltable at a tilt angle '0' around a pivot pin on the elongated arm 422 of the hitch base 418. In case the support assembly 108 hits the ground, the support assembly 108 may be tilted around the hitch base 418 to prevent any damage thereof. FIG. 4D illustrates a sectional view of the support assembly 108 through the locating device 102.

Figure 4E:
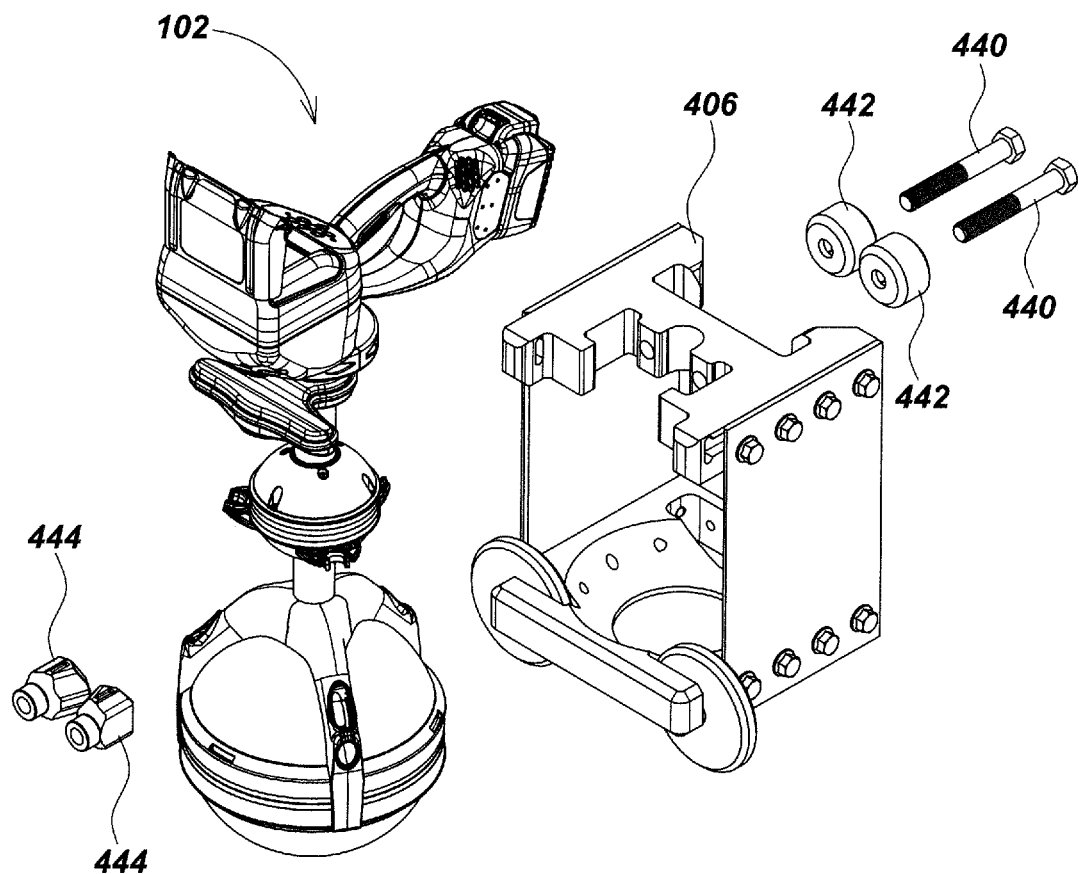

Further, FIG. 4E shows an exploded view of the locating device 102 mounting arrangement on the support assembly

108. As shown, the mounting arrangement may include fasteners, such as bolts 440, attachment bolts/clamps 442, and attachment knobs 444, fastened to secure the locating devices 102 fixedly on respective locator mounting assemblies 406. The fasteners shown in the FIG. 4E may be designed to facilitate mounting of the locating device 102 within the locator mounting assembly 406 to be performed by bare hand without the need of using any fastening tools.

Figure 4F:
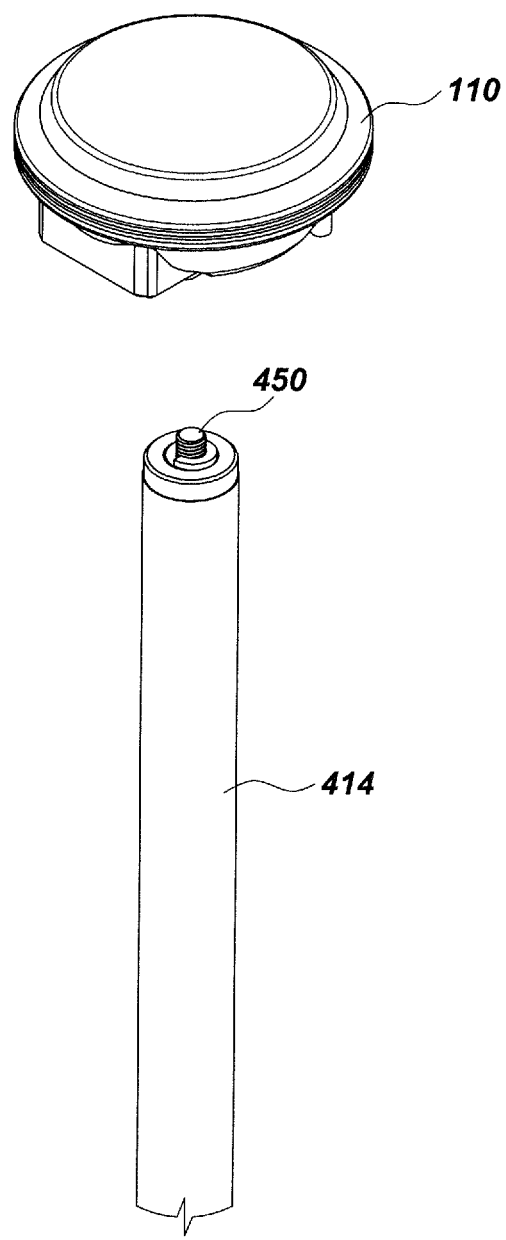

FIG. 4F illustrates an exploded view of the mounting arrangement of the positioning device 110 over the support assembly 108. As shown, the elongated mast 414 may be provided with a threaded end 450 onto which the positioning device 110 may be threaded and secured thereof.

The elongated mast 414 may be adjustable in length depending on height of the vehicle 104. For instance, the elongated mast may be adjusted such that the positioning device 110 supported thereon reaches close to the roof of the vehicle 104. The elongated mast 414 may further include a security lock (not shown) for securing the positioning device 110 for theft prevention. The elongated mast 414 may also include a positioning tracking dipole (not shown), such as a GPS dipole or sonde operating at a predefined frequency, which in one example, may be around 585 Hz.

Figure 4G:
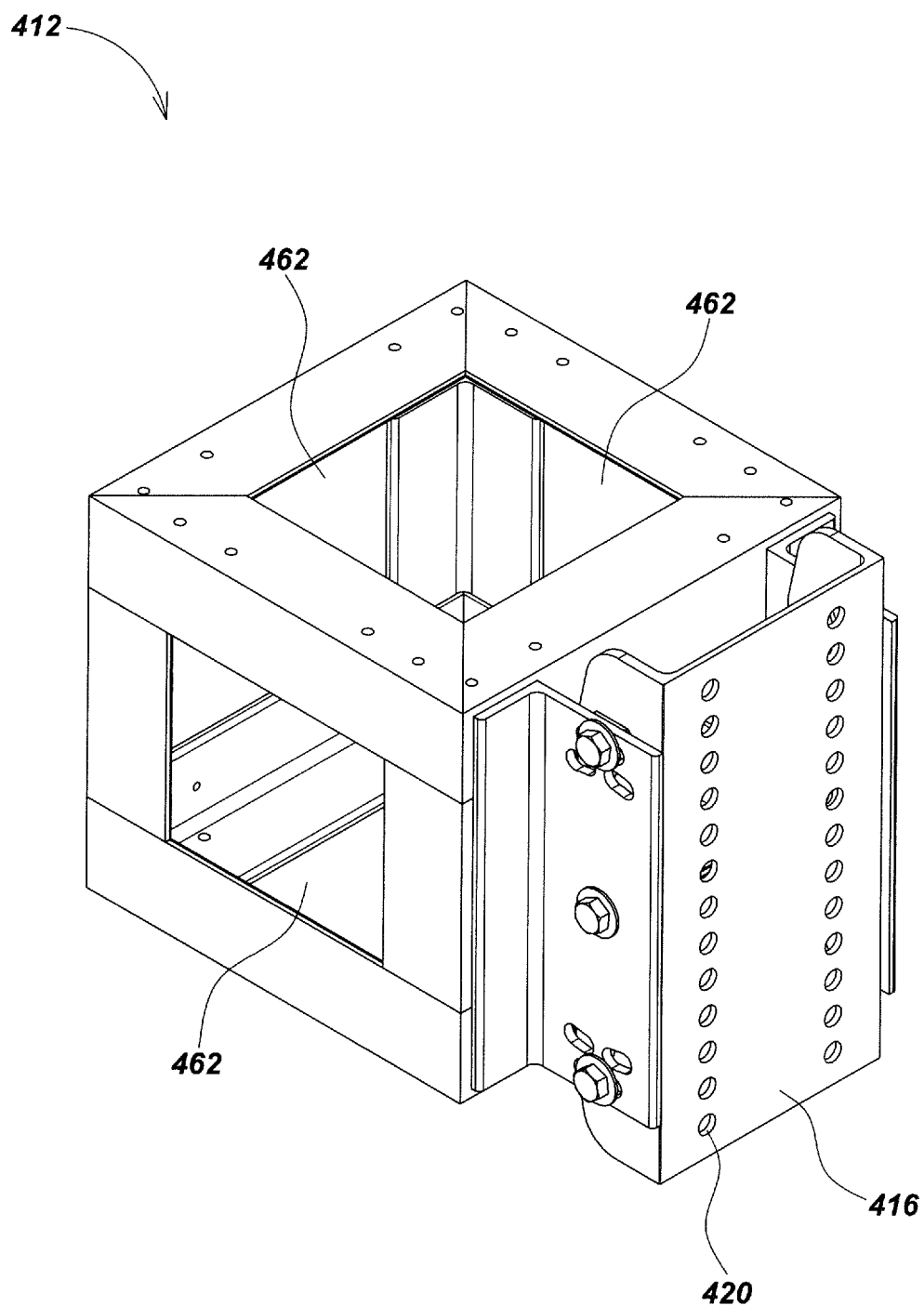
Figure 4H:
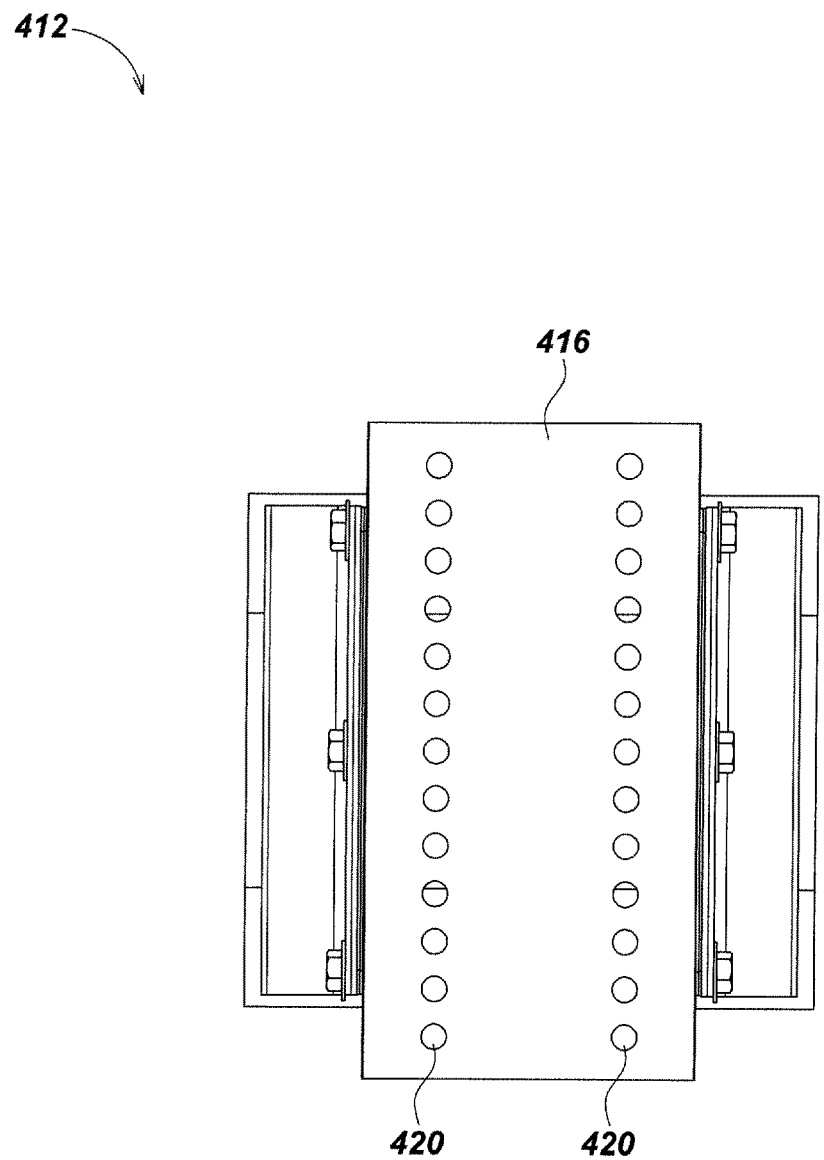
Figure 4I:
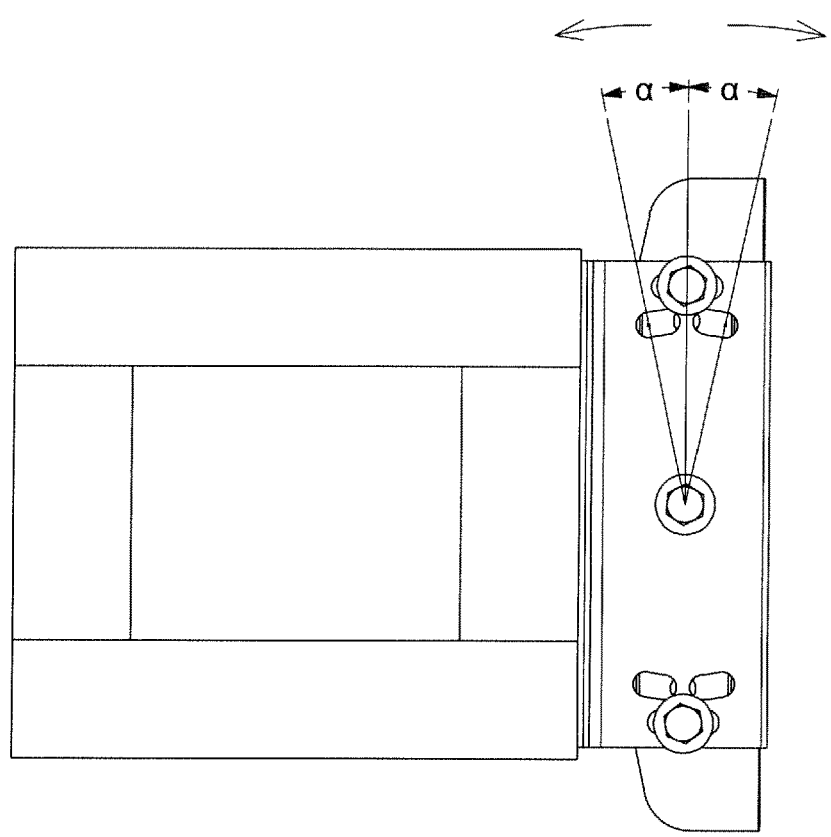

FIG. 4G illustrates a standalone view of the central mounting assembly 412 including a tubular hollow body having a window 462 on each face and an elongated plate 416 positioned to face the vehicle's hitch. As described above, the elongated plate 416 may include a plurality of holes 420 created thereon enabling adjustment or readjustment of the support assembly 108 at various heights onto the vehicle's hitch. A front view of the central mounting assembly with the elongated plate 416 may be best seen in the FIG. 4H, and a side view of the central mounting assembly may be seen in the FIG. 4I.

It is to be understood that the support assembly 108, its specific components and/or arrangement described above by way of an example should not be construed in a limiting sense. The support assembly 108 may have other components and/or different arrangements capable of supporting locating devices 102 onto the moving vehicle 104, which are within the scope of the subject matter.

The systems and the methods for locating and/or mapping buried utilities, in accordance with the present disclosure, embodying the locating devices 102, the support assembly 108, and/or the positioning device 110, is now be described in the forthcoming description with reference to FIGS. 5A-9B.

Figure 5A:
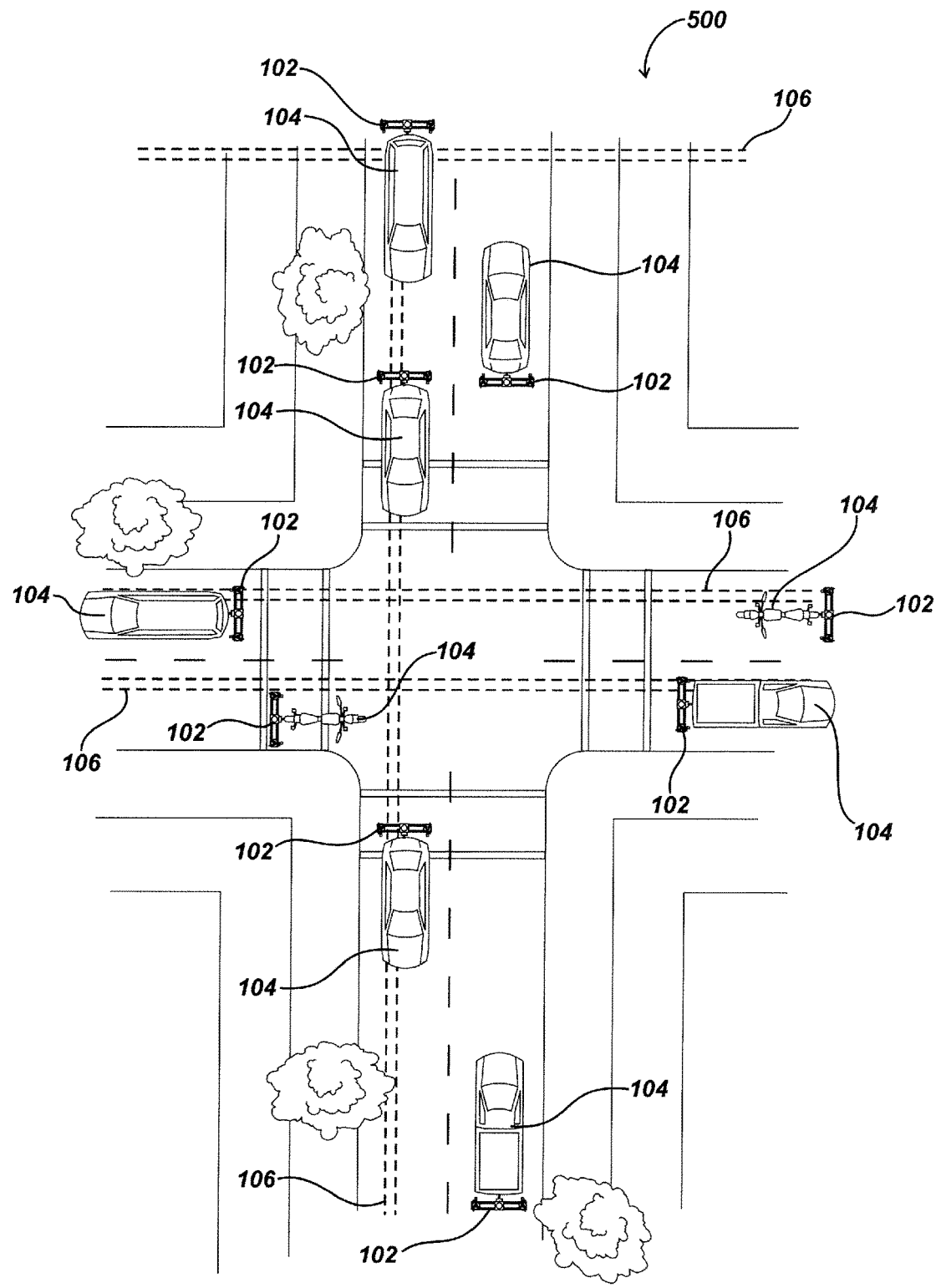
FIGS. 5A-5B illustrate embodiments of a system for locating and/or mapping a buried utility using locating devices mounted on a vehicle moving along a path of the buried utility.
Figure 5B:
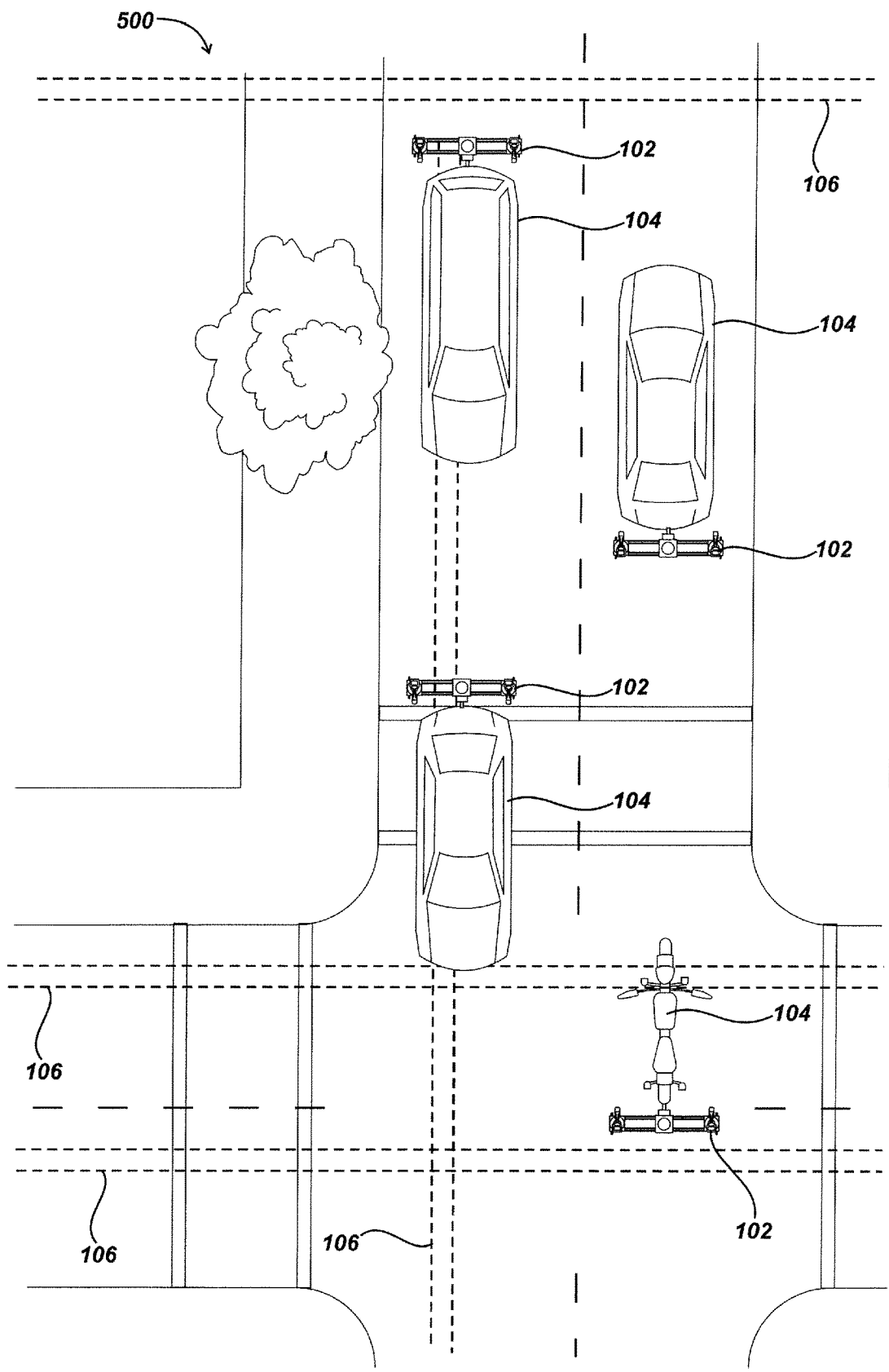

FIGS. 5A-5B illustrate a system 500 for locating and/or mapping one or more buried utilities 106 using locating devices 102 mounted on one or more vehicles 104 moving along and/or crossing the paths of the buried utilities 106 described in accordance with an embodiment of the present disclosure.

The system may include a pair of locating devices 102 mounted on each vehicle 104, a support assembly 108 for receiving and supporting the locating devices 102 in a fixed orientation on respective vehicles 104, and a positioning device 110 also supported by the support assembly 108 on the vehicles 104. The positioning device 110 may be positioned centrally from the locating devices 102 and is operably coupled to the locating devices 102 for processing signals/utility data received from the locating devices 102 to generate an absolute position of the buried utilities 106 in a relative coordinate system.

As vehicle travels over or crosses a path of buried utility, where the path may be a busy street having one or more utilities buried underneath (as shown in FIGS. 5A-5B), the locating devices 102 mounted on respective vehicles 104 may respond to location of one or more buried utilities 106 and collect utility data (e.g. in the form of active and passive magnetic field signals. The collected utility data may be subsequently processed to detect location of the buried utilities. According to one aspect, the utility data may be processed in accordance with the velocity of the respective moving vehicles 104.

The detected location and associated utility data may be subsequently obtained by respective positioning devices 110. The positioning devices 110 either alone or in combination with additional devices and/or components, may be configured to synchronize and/or collect utility data from other moving vehicles, for example, from the locating devices and/or positioning device mounted on the other moving vehicles. The utility data, thus, obtained may further be processed at respective positioning devices 110 to generate an absolute position, depth, and orientation of the one or more buried utilities 106, which may be provided to an electronic device associated with respective moving vehicles 104.

Figure 5C:
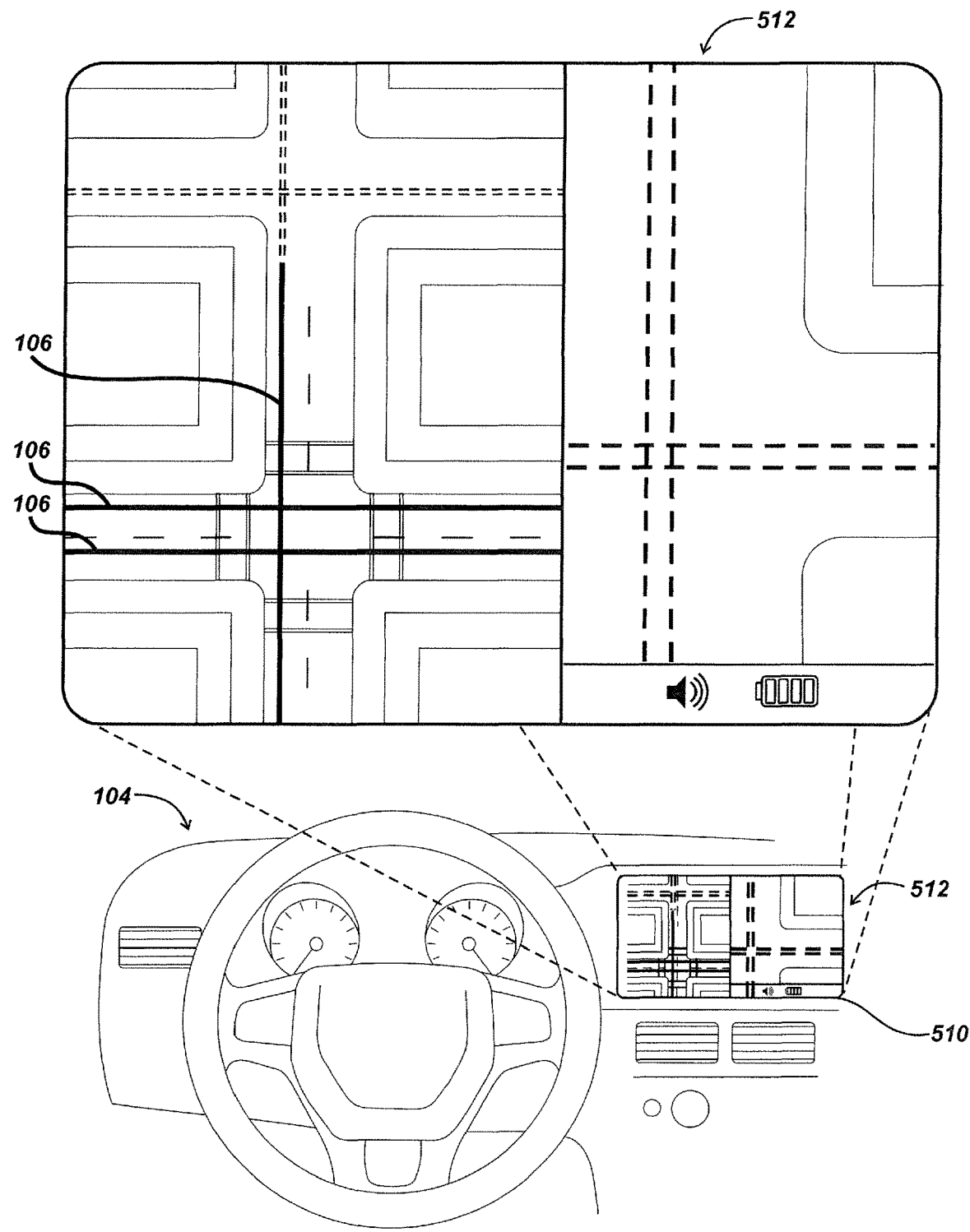
FIG. 5C illustrates an embodiment of a vehicle-mounted electronic device.

As shown in the FIG. 5C, at the electronic device 510, which in this example is a vehicle-mounted electronic device, the location of the one or more buried utilities 106 may be displayed in the form of a map 512, such as a navigational map, of a geographical region. The map 512 may keep on updating continuously to depict real-time position of the buried utilities 106, as the vehicle 104 moves over or crosses the path of the buried utilities 106. The map 512 may further display a real-time view of the vehicle 104 on the road and forthcoming path In another aspect, the map 512 may further display location of other buried utilities detected by other vehicles 104 moving in the vicinity. In one aspect, a real-time audio and/or visual feedback or guidance may be provided to assist a user, such as a vehicle operator, to return to the path of corresponding one or more buried utilities when the vehicle or an operator loses track of the buried utilities, and/or may provide a feedback suggesting the operator to slow down the vehicle, if safe to do so, for improving strength of the signals collected thereof.

Figure 6A:
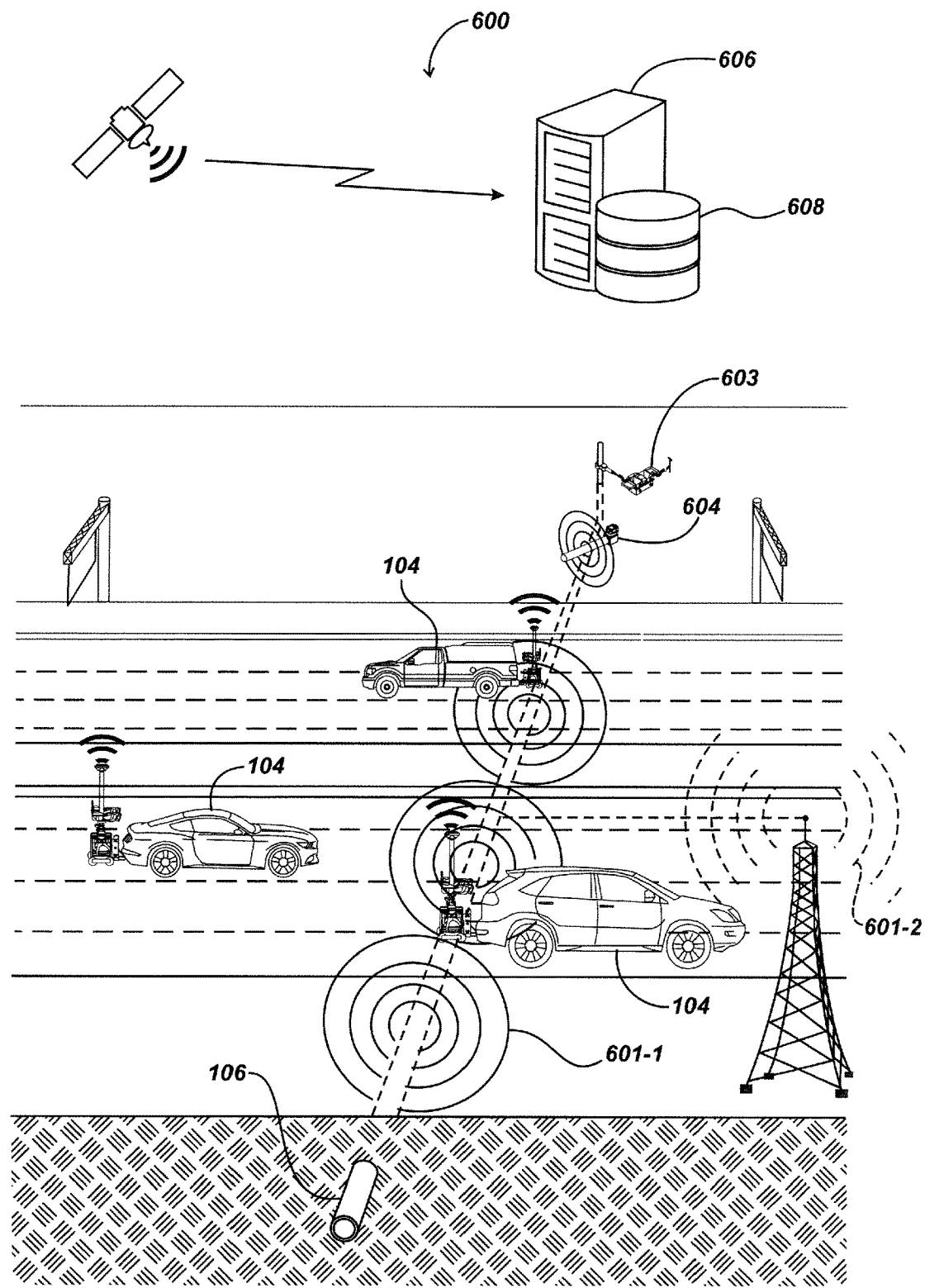
FIGS. 6A-6B illustrate embodiment of a system for locating and/or mapping a buried utility using locating devices mounted on a vehicle moving along a path of the buried utility.
Figure 6B:
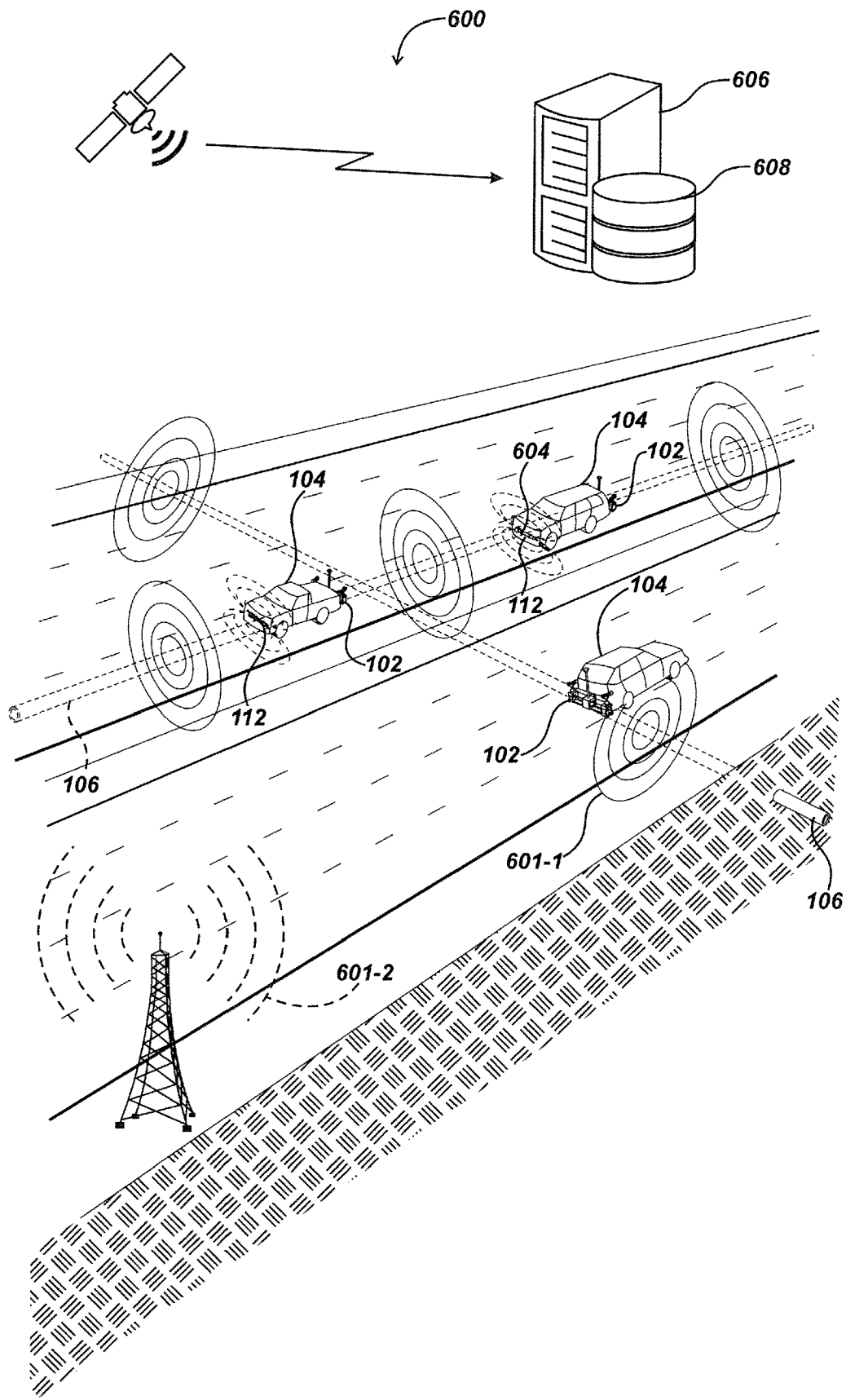

Referring to the FIGS. 6A-6B now that illustrate other embodiments of a system 600 for locating and/or mapping a buried utility using locating devices 102 mounted on one or more vehicles 104 moving along or crossing a path of the buried utility 106. The system 600 may include locating devices 102 mounted on a plurality of vehicles 104 moving along or crossing the path of the buried utility, which in this example, is a freeway having a utility buried underneath. The location devices 102 may include, amongst several other components, one or more antenna nodes 306 configured to detect magnetic field signals 601-1 and 601-2 (collectively referred to as 'magnetic field signals 601') radiated from the buried utility. The magnetic field signals 601 may include active magnetic field signals 601-1 directly associated with the buried utility, and passive magnetic field 601-2 (e.g., radio broadcast signal) radiated from a radio broadcast station, which when encountering a portion of a buried utility 106, induces a current in the buried utility 106 that generates an electromagnetic field around the buried utility 106.

The system 600 may further include a support assembly 108 to receive and support the locating devices 102 on the vehicles 102. The support assembly 108 may be made of a partially non-magnetic and/or non-conductive material, for example, at least in the region surrounding the locating devices 102. In another example, the support assembly 108 may be made completely of a non-magnetic and/or non-conductive material. Further, the system 600 may include a positioning device 110 also supported on the vehicles 104 by the support assembly 108, whereby the positioning device 110 may be operably coupled to the locating devices 102 on respective vehicles 104 for processing signals/utility data received therefrom to generate position of the buried utility 106 in a relative coordinate system. The positioning device 110, referred herein, may also either be directly attached to the locating devices 102, or integrated into the locating devices 102.

As shown in the FIG. 6A, the system 600 may further include active transmitter(s) 603 and/or inductive coupling device(s) 604 coupled to the buried utility line for actively transmitting and/or inducing current into the buried utility line 106. In another aspect shown in the FIG. 6B, the inductive coupling device 604 may be mounted on the vehicles having locating devices 102 mounted thereto for inducing current into the buried utility 106, and for tuning to signals induced by other moving vehicles 104. The system 600 may further includes a remote server 606 coupled to the locating devices 102 mounted on the vehicles 104 via a suitable communications technology which, in specific examples described herein is a GPS technology; however any suitable communications technology can be utilized herein. The remote server 606 may include a database 608, which may be a non-transitory internal memory implemented within the remote server 606, or a non-transitory external memory coupled to the remote server 606. In one embodiment, the remote server 606 may be implemented in a cloud environment (not shown) where the remote server 606 may correspond to a cloud server operably coupled to the locating devices 102, and the database 608 may correspond to a cloud database coupled to the cloud server.

As vehicle 104 travels over or crosses the path of buried utility 106, the locating devices 102 mounted thereon respond to a location of the buried utility 106, and collect utility data, which is processed at the respective locating devices 102 to detect location of the buried utility 106. The data collection and processing may be performed in accordance with the velocity of the vehicle 104. The detected location and/or utility data may be obtained by the positioning device 110, and may be further processed at the positioning device 110 to generate an absolute positioning of the buried utility 106 that may be, along with other utility data, transmitted to the remote server 606. The detected location and/or associated utility data, in other examples, may be directly transmitted to the remote server 606 from the locating devices 102.

In one embodiment, data transmission to the remote server 606 may occur in real-time or near real-time. In another embodiment, the data transmission may occur at periodic intervals, at a predefined time period, say, at the end of the day. Further, the data transmission may occur automatically based on preconfigured rules and/or algorithms, or an operator may manually upload the utility data onto the remote server 606. In some embodiments, a prepaid mailing service may be provided by an entity managing the remote server 606 to operators of the vehicles 104, for mailing a removal storage media (e.g., a USB) containing the collected utility data at a certain time interval, say at the end of the day, or at the end of the week. Upon receiving the utility data, the entity may upload the utility data on the remote server 606, and may return the removal storage media to respective operators. The above described ways of transmitting the utility data to the remote server 606 are not intended to be construed in a limiting sense. Any suitable data transmission methods or technologies may be utilized to transmit the utility data to the remote server 606.

Upon receiving the utility data, the remote server 606 may store the utility data obtained collaboratively from the locating devices mounted on the plurality of vehicles 104, in the database 608, and may process the utility data based on preconfigured algorithms, techniques, rules, and/or parameters, to detect location of the buried utility, based on which, the remote server 606 may generate one or more maps that may be provided to corresponding users on their electronic devices, via a suitable communication channel. The remote server 606 may either be configured to post-process the utility data, or process the utility data in real-time or near real time, based on a velocity information associated with the moving vehicle 104.

Such a remote server 606 is now described in greater detail with reference to the FIGS. 7A-7C.

The remote server 606, as described herein, may be any electronic device capable of computing, such as a computer, a server, a cluster of computers or servers, cloud computing, server farm, server farms in different locations, etc. The remote server 606 may include multiple and separate components that may be electrically connected or interfaced with one another as appropriate. The remote server 606 may be accessible to a plurality of electronic devices 510 associated with the moving vehicle 104 and/or its user/operator, via a communication link 702, which may include a satellite communication, or any type of network or a combination of networks. For example, network may include a local area network (LAN), a wide area network (WAN) (e.g., the Internet), a metropolitan area network (MAN), an ad hoc network, a cellular network, or a combination of networks.

The electronic device 510 may include display device, computing device or a wireless telecommunications device such as smart phone, personal digital assistant (PDA), wireless laptop, a notebook computer, a navigational device (e.g. a global positioning system (GPS) device), or any portable device capable of displaying and/or manipulating the maps, or executing a navigation application. The electronic devices 510 may further include vehicle mounted display devices. In one example, the remote server 606 may include a software application hosted thereon, which is accessible by the electronic device 510. In another example, the remote server 606 may provide proprietary programs or applications (apps) executable on each of the electronic devices 510.

Figure 7A:
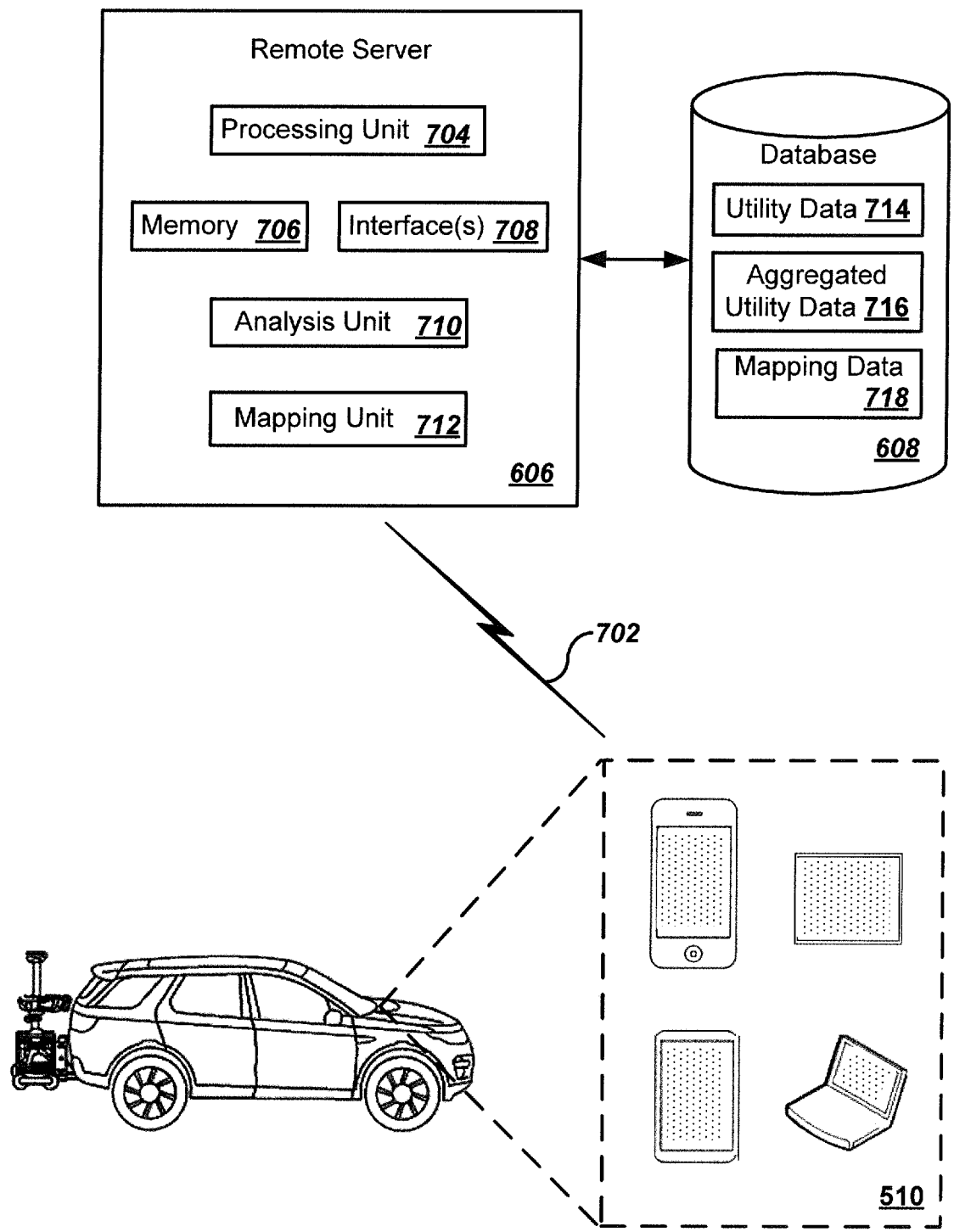
FIG. 7A illustrates an embodiment of a remote server implemented within the system, and associated components of the remote server.
Figure 7B:
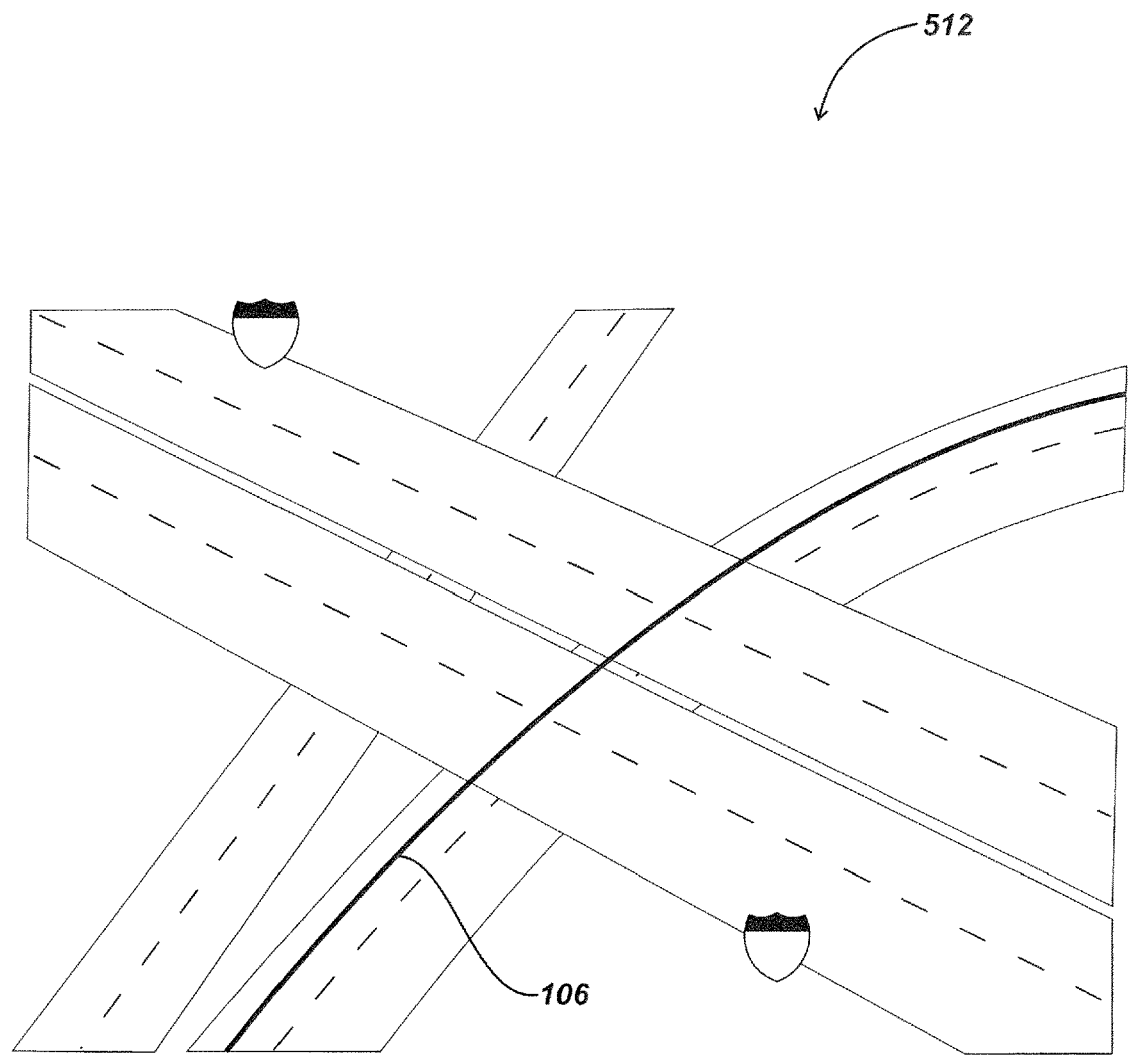
FIGS. 7B-7C illustrate exemplary maps generated in accordance with various embodiment of the present disclosure.
Figure 7C:
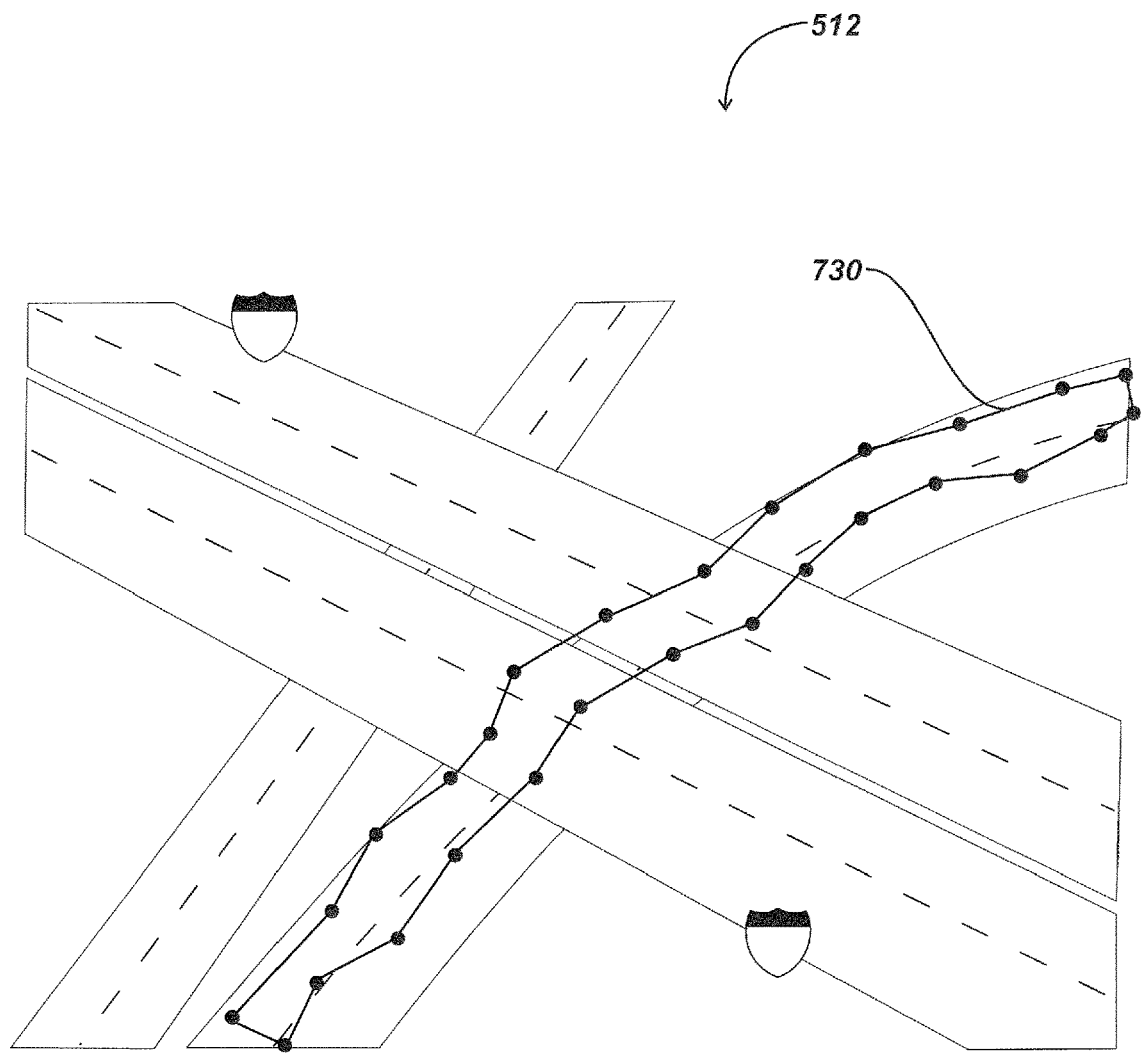

As shown in the FIG. 7A, the remote server 606 may include a processing unit 704, a memory 706 coupled to the processing unit 704, interface(s) 708, an analysis unit 710 coupled to the processing unit 704, and a mapping unit 712 coupled to the processing unit 704. The remote server 606 may further includes the database 608 configured to centrally maintain the utility data obtained from a plurality of locating devices 102 mounted on a plurality of vehicles 104. The database 608 may be a non-transitory memory implemented either within the remote server 606 (e.g., the memory 706), or located externally of the remote server 606 and coupled thereto.

The processing unit 704 may include a single processor, or multiple processors, all of which could include multiple computing units. The processor(s) may be implemented as one or more microprocessors, microcomputers, microcontrollers, digital signal processors, central processing units, state machines, logic circuitries, field-programmable gate array (FGPA), and/or any devices that manipulate signals based on operational instructions. Among other capabilities, the processor(s) is configured to fetch and execute computer-readable instructions and data stored in the memory.

The memory 706 may include any computer-readable medium known in the art including, for example, volatile memory, such as static random access memory (SRAM) and dynamic random access memory (DRAM), and/or non-volatile memory, such as read only memory (ROM), erasable programmable ROM, flash memories, hard disks, optical disks, and magnetic tapes.

The interface(s) 708 may include input/output interfaces, and a graphical user interface enabling a user to communicate with the remote server 606 by requesting and receiving information therefrom.

The analysis unit 710 and the mapping unit 712 may be different modules that may include, amongst other things, routines, programs, objects, components, data structures, or software instructions executable by the processing unit to perform particular tasks or methods of the present disclosure.

In one aspect, the analysis unit 710 may obtain utility data pertaining to one or more buried utilities 106 from one or more locating devices 102 mounted on corresponding vehicles 104. The vehicles 104 may include different vehicle(s) moving along a path of the buried utility, same vehicle(s) moving along or across a path of the buried utility in multiple passes, or a combination thereof. The vehicles 104, in one example, may be separated in time and/or space. The utility data may include geographic location coordinates of the utility, for example, latitude and longitude of the utility, geometric reference of the utilities, depth, and the like. Upon receiving the utility data, the analysis unit 710 may be configured to process the utility data. The processing may include, for example, aggregating the utility data pertaining to each of the buried utilities. The analysis unit 710 may store the utility data as the utility data 714 in the database 608, and the processed data, which in said example, is the aggregated data as the aggregated utility data 716 in the database 608 from where it may be retrieved, when required.

The mapping unit may obtain the aggregated utility data 716 from the database 608, and process the aggregated utility data 716 based on preconfigured algorithms, techniques, rules, and/or parameters to detect an optimized location of the buried utility 106. The processing performed by the mapping unit 712 may include comparing the aggregated utility data, pertaining to a specific buried utility obtained from different sources (e.g., different locating devices and/or vehicles) to identify an optimal location of the buried utility, which may be stored as mapping data 718 into the database 608. The processing may further include ranking the utility data based on predefined parameters or using preconfigured ranking algorithms to identify an optimal location of the buried utility. Also, the processing may include executing preconfigured optimization algorithms to identify an optimal location of the buried utility. As a result of the processing, the mapping unit 712 may be configured to generate a map 512, as shown in the FIG. 7B, indicative of the optimized location of the buried utility 106. This map 512 may be provided to corresponding users on their respective electronic devices 510, via the communication link 702.

In some embodiments, the mapping unit 712 may ascertain a set of locations for the buried utility 106 based on the aggregated utility data. For instance, the mapping unit 712 may be configured to receive the utility data and apply a preconfigured algorithm to generate a set of locations, which may be identified in terms of data points within a geographical region. For the identified set of locations, the mapping unit 712 may evaluate probability scores using preconfigured probability algorithms, and generate a map 512, as shown in the FIG. 7C, depicting a probability contour 730 indicative of probable locations of the buried utility, and additionally the associated probability scores. The map 512 may be provided to users on their respective electronic devices 510, via the communication link 702.

In an embodiment, the mapping unit 712 may be configured to overlay the detected location(s) of the buried utility 106 on a pre-existing map of the geographical location, which is preloaded onto the electronic device 510. In another embodiment, the mapping unit 712 may be configured to obtain a map of the geographical region from one or more data sources including government entities, commercial entities, and/or private entities, and then map the detected location(s) of the utility and associated utility data to the geographical map to depict location(s) of the buried utilities on the geographical map. The maps and/or detected location(s) may be updated by the mapping unit 712 upon receiving real-time location updates to maintain up-to-date mapping of the buried utility 106 to the geographical map.

The map 512 may be a user navigable map depicting the buried utility/utilities within a geographical region, and directing a user to desired buried utility. The maps may also depict nearby landmarks and distance of the buried utilities from such landmarks to provide more additional information to user to locate the buried utility 106. The map 512 may further include images and/or videos of the buried location(s) to assist the user with finding the location.

Figure 8A:
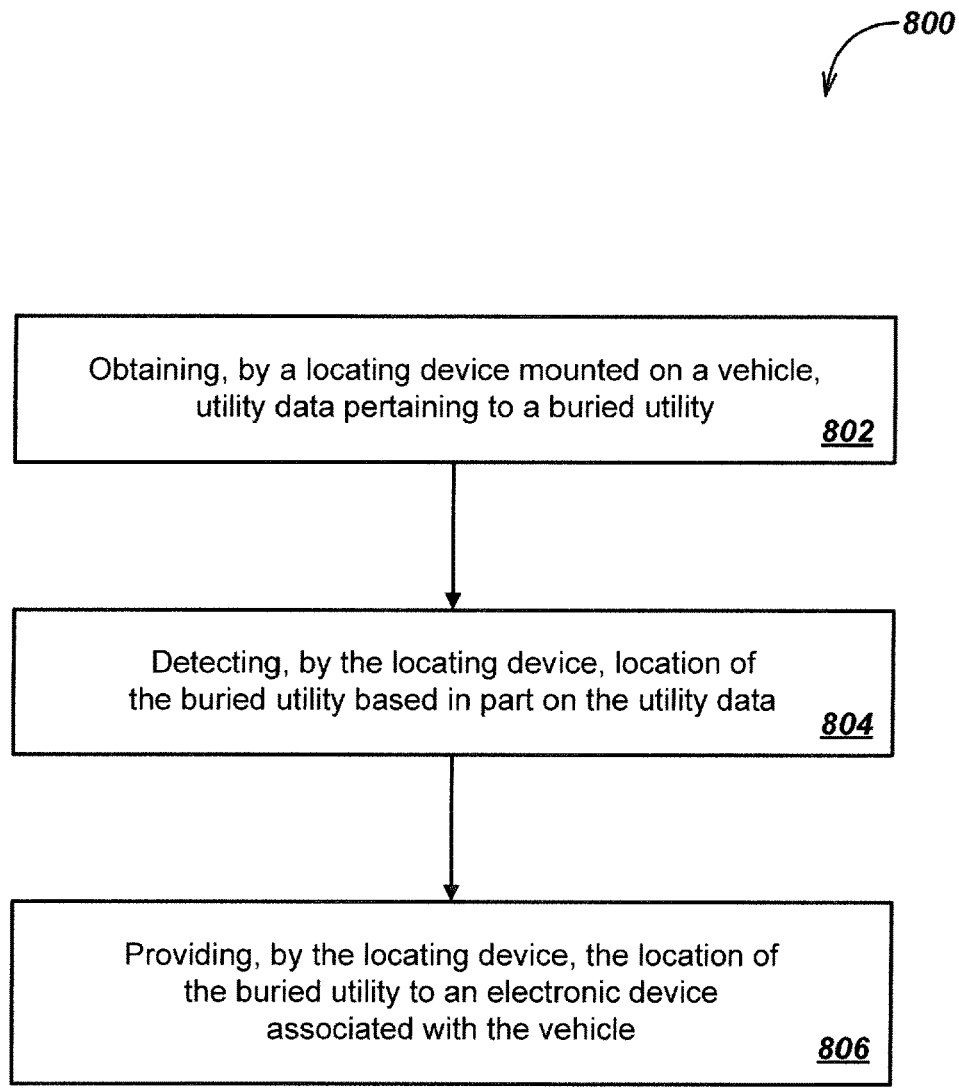
FIGS. 8A-8H illustrate an embodiment of a method for locating and/or mapping buried utilities using vehicle-mounted locating devices.
Figure 8B:
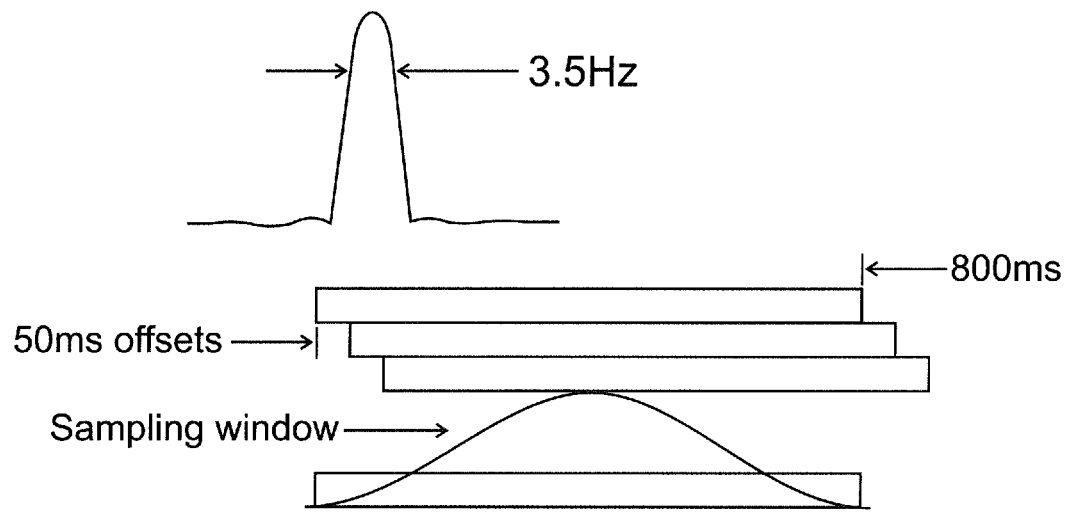
Figure 8C:
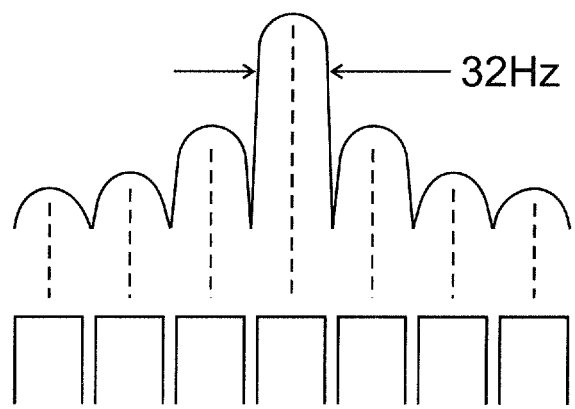
Figure 8D:
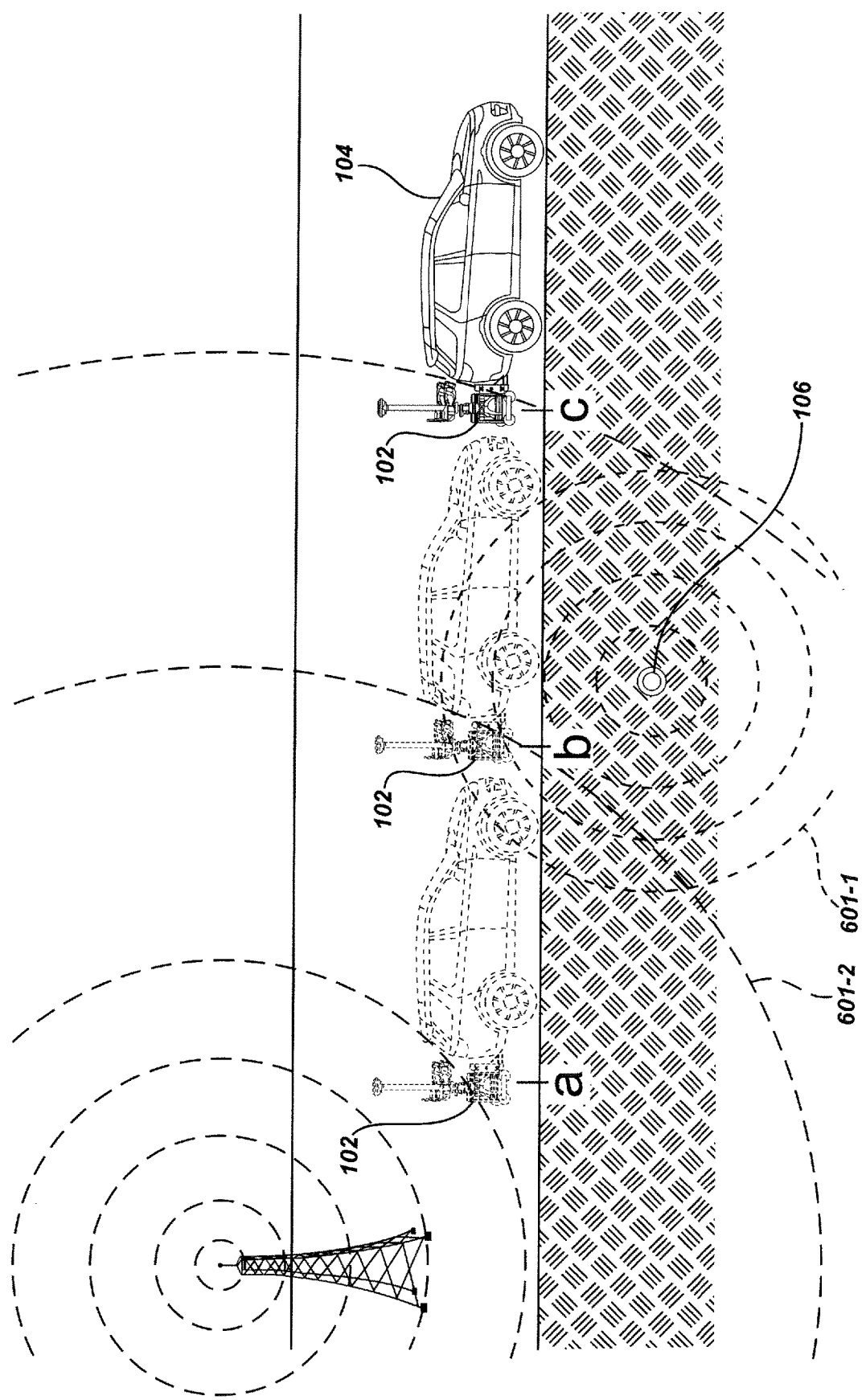
Figure 8E:
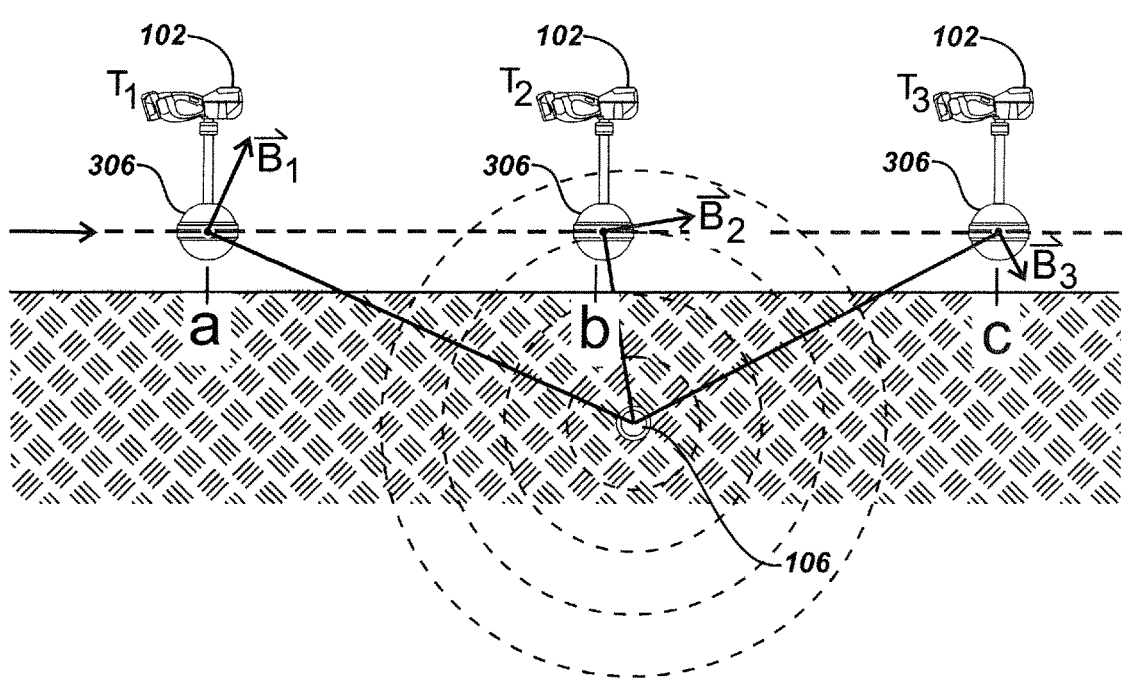
Figure 8F:
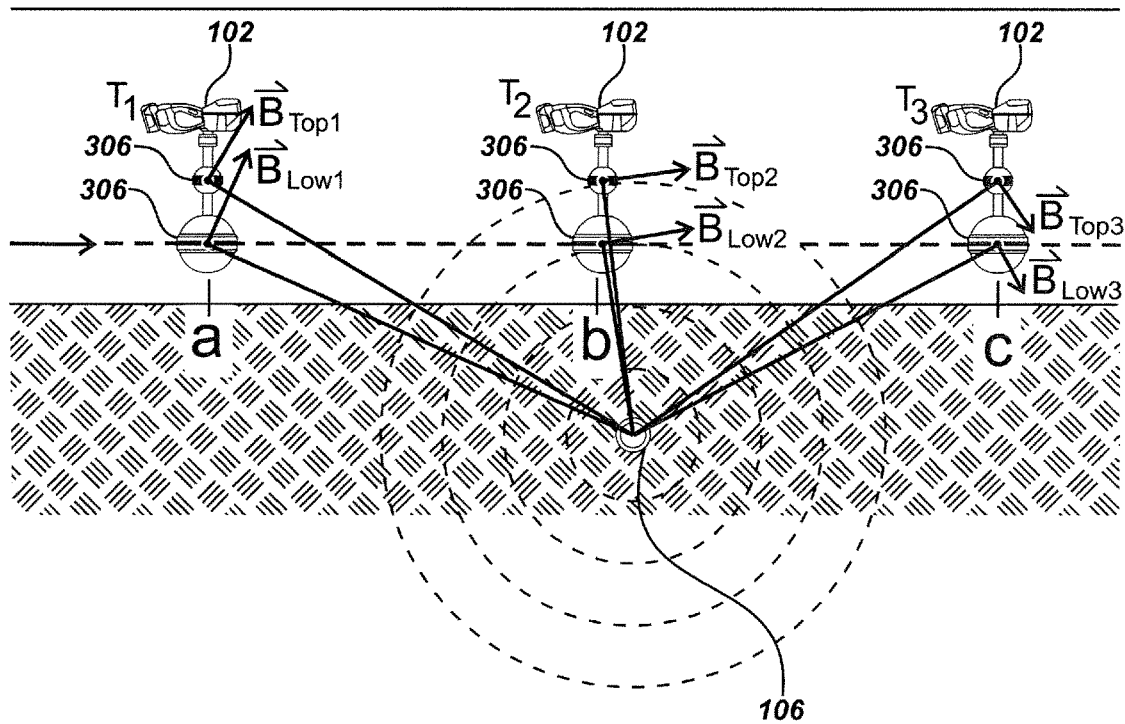
Figure 8G:
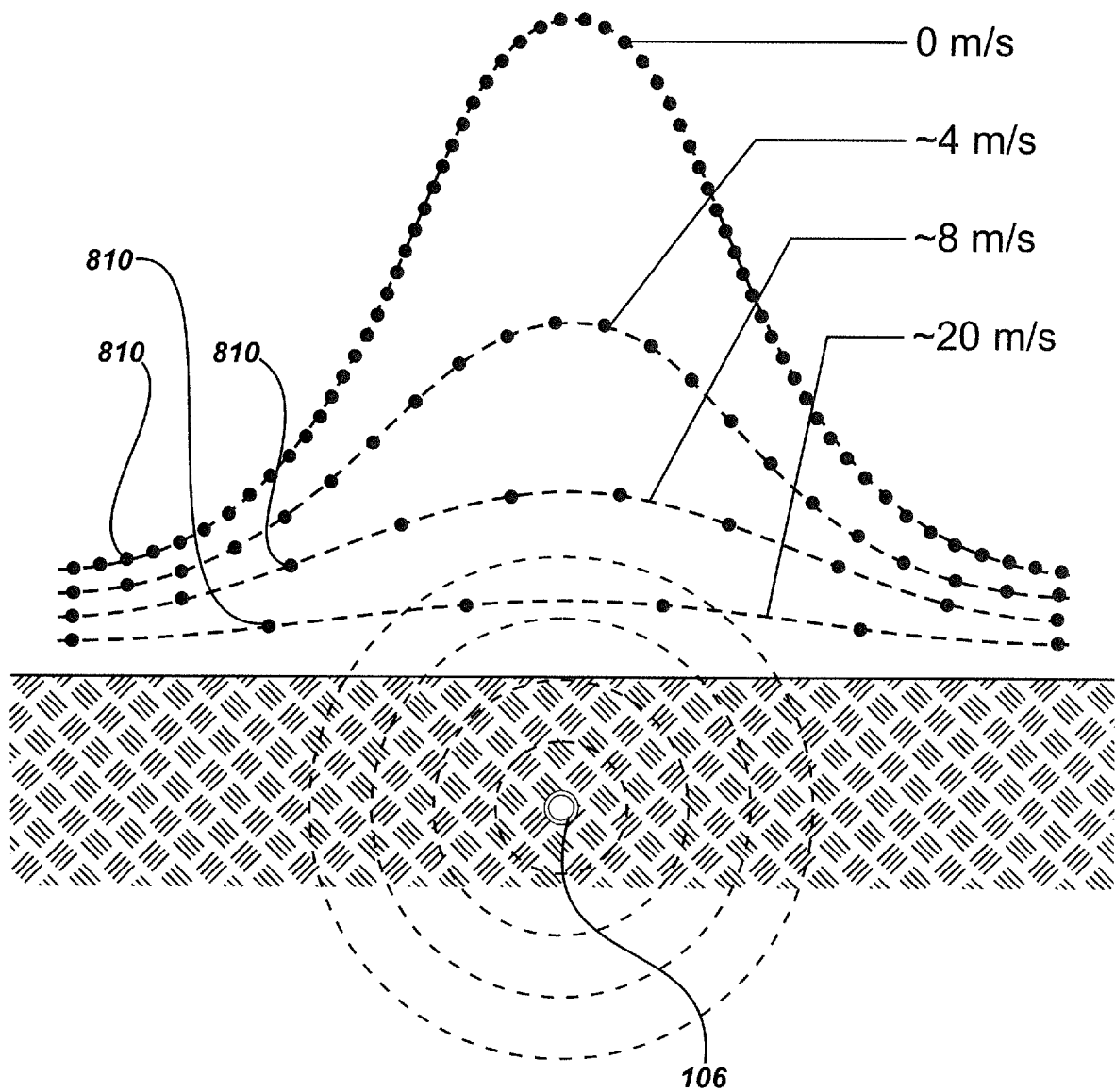
Figure 8H:
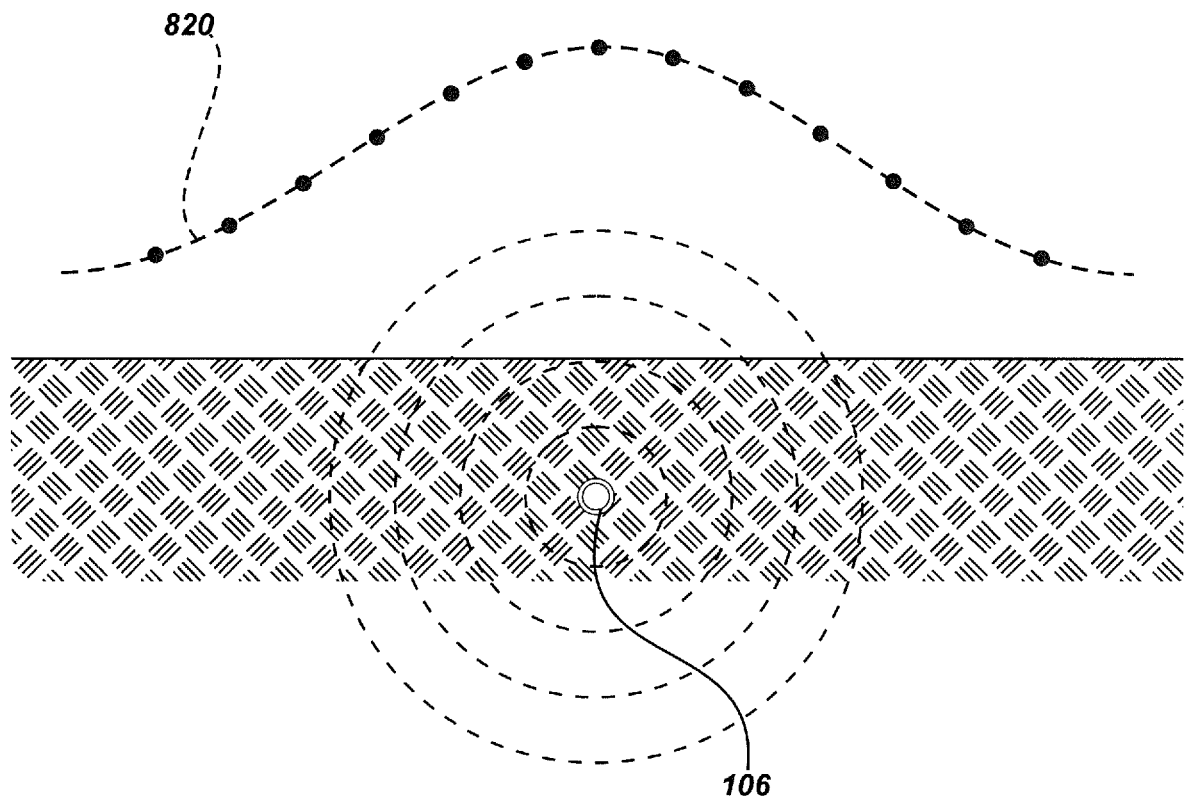

FIG. 8A illustrates an embodiment of a method 800 for locating and/or mapping buried utilities using vehicle-mounted locating devices.

The method is initiated at block 802, where the method may include obtaining utility data pertaining to a buried utility. One or more locating devices 102 may be mounted on the vehicle 104 to collect utility data pertaining to a utility which is buried along or across a path of the vehicle 104.

The utility data may include, but is not limited to, the presence or absence, position, depth, current flow magnitude, phase, and/or direction, and/or orientation of underground utility lines and/or other conductors, information about soil properties, other changes in properties of pipes or other conductors in time and/or space, quality metrics of measured data, and/or other aspects of the utility, and/or the locate environment. The utility data may further include data received from various sensing units 310 including, but not limited to, motion sensors, such as accelerometers, gyroscopes, magnetometers, altimeters, and the like, temperature sensors, humidity sensors, light sensors, barometers, sound, gas, radiation sensors, and other sensors provided within or coupled to the locating devices. The utility data may also include data received from ground tracking device(s), and timestamps associated with the utility data. The utility data may be in the form of magnetic field signals radiated from the buried utility.

At block 804, the method may include detecting location of the buried utility based in part on the utility data. The locating device(s) 102 may processes the utility data to detect location of the buried utility. The locating device 102 may include, amongst several other components, one or more processing units 308 adapted to process the utility data in conjunction with velocity information of the moving vehicle. The processing may include simultaneously processing of a combination of active and passive magnetic field signals emitted from a buried utility to detect location/position of the buried utility and associated utility data indicative of depth and orientation of the utility.

The processing may further include sampling the active magnetic field signals using discrete Fourier transform (DFT) filter(s) at a first predefined sampling rate. In an example, the first predefined sampling rate may be within a range of 5 Hz to 20 Hz. In another example, the first predefined sampling rate may be 20 Hz, as shown in the curve illustrated in FIG. 8B. In another example, the first predefined sampling rate may be more than 20 Hz. The processing may also include sampling the passive magnetic field signals using DFT filters at a second predefined sampling rate. In an example, the second predefined sampling rate may be, not in a limiting sense, 32 Hz, as shown in the curve illustrated in FIG. 8C. The sampling rate may be defined, configured, or reconfigured, based on an expected maximum velocity of the moving vehicle. Further, the sampling rate may be self-adjusted, dynamically, based on a real-time velocity information pertaining to the moving vehicle.

The processing may further include determining gradients from tensor derivatives of a signal's magnetic field vector, hereinafter referred to as 'gradient tensors', at regular intervals as the vehicle moves along a path of the utility. As shown in the FIG. 8D the vehicle is crossing the path of the utility 106, and the locating devices 102 mounted onto the vehicle 104 are detecting active magnetic field signals 601-1, and passive magnetic field signals 601-2. As the vehicle 104 moves at regular intervals, say, at intervals 'a', and 'c' as shown, gradient tensors T1, T2 and T3 may be determined based on the magnetic field vectors $B_1$, $B_2$, and $B_3$ as illustrated in the FIG. 8E. In an instance, where the locating device 102 comprises two antenna nodes 306, as show in the FIG. 8F, the gradient tensors T1, T2 and T3 may be determined based on the magnetic field vectors ($B_{Top1}$, $B_{Low1}$), ($B_{Top2}$, $B_{Low2}$), and ($B_{Top3}$, $B_{Low3}$), where $B_{Top1}$, $B_{Top2}$, and $B_{Top3}$ correspond to magnetic field vectors derived from the top antenna nodes respectively, and $B_{Low1}$, $B_{Low2}$, and $B_{Low3}$ correspond to magnetic field vectors derived from the lower antenna nodes respectively. These gradient tensors and/or tensor components thereof may be used to determine location of the buried utility 106. The location of the buried utility 106 may be determined at regular intervals as the vehicle 104 moves along or crosses the path of the buried utility 106. The location determined at regular intervals is interchangeably referred to as location data points in the forthcoming description.

In some embodiments, the processing may further include associating timestamps with each of the location data points, whereby the timestamps are relative to a precise pulse synchronization signal, such as 1PPS synchronization signal, received from a positioning device 110. The location data points when combined and correlated in a time domain may provide a complete view and detailed information about the buried utility 106. The processing may additionally include analyzing and correlating data obtained from a ground tracking device and/or camera element(s) in the time domain to determine depth and orientation of the buried utility 106.

In an example, a gap between the location data points may depend on a velocity information of the vehicle 104. As shown in the curve 820 illustrated in the FIG. 8G, an increase in velocity of the vehicle 104 may increase the gap between the location data points 810. Further, with the increase in the vehicle's velocity, signal strength of the utility data collected by the locating devices 102 may often be reduced leading to smearing of the signals as shown in the curve 8H. This smearing of the signals is commonly referred to as a "motion blur". The data processing unit(s) 308 carried out in accordance with the embodiments of the present subject matter may deconvolves the motion blur based on reconstructing the smeared out signal back to its original signal strength, i.e., to a full signal strength which is typically observed when the vehicle 104 is still (i.e., velocity of the vehicle is 0 m/s).

Returning to FIG. 8A, at block 806 the method may include providing the detected location of the buried utility to an electronic device 510 associated with the vehicle 104. For instance, the detected location may be provided in the form of a map which may be displayed on the electronic device. At the electronic device 510, the location/map 512 may be dynamically updated to display a real-time position of the buried utility 106, as the vehicle 104 moves over the path of the buried utility 106. A real-time audio and/or visual feedback may be provided to guide the user, such as a vehicle operator to the buried utility, and assist the user to return to the path of a buried utility 106 when vehicle 104 or the user loses track of the buried utility 106.

Figure 9A:
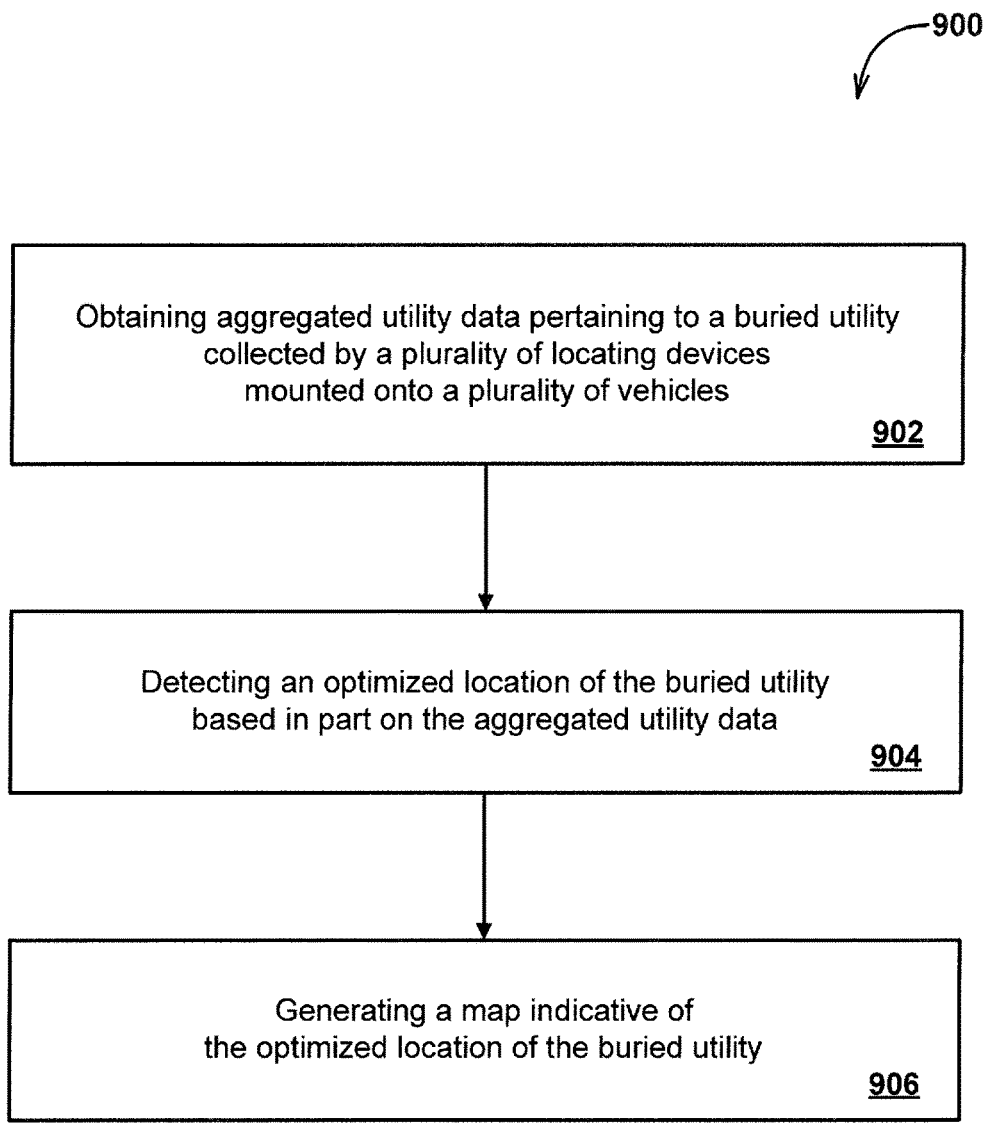
FIG. 9A illustrates another embodiment of a method for locating and/or mapping buried utilities using vehicle-mounted locating devices.

FIG. 9A illustrates an embodiment of a method 900 for locating and/or mapping buried utilities using vehicle-mounted locating devices.

At block 902, the method may include obtaining aggregated utility data pertaining to a buried utility 106 collected by a plurality of locating devices 102 mounted onto a plurality of vehicles 104 moving along or crossing a path of the buried utility 106. The aggregated utility data may be generated based on receiving data pertaining to buried utilities from a plurality of locating devices 102 mounted onto a plurality of vehicles 104 moving along or crossing a path of the buried utilities 106, and pre-processing the collected utility data at the remote server 606. The pre-processing may include aggregating the utility data pertaining to each of the common buried utilities 106, and storing the aggregated data separately in a database 608. The process of determining the utility data pertaining to a common buried utility may involve matching spectral signatures and harmonics data (e.g. 60 Hz harmonics data), which if matched indicates the utility data pertaining to the common buried utility. The pre-processing may additionally include applying pre-configured algorithms and/or rules to aggregate the utility data.

At block 904, the method may include detecting an optimized location of the buried utility based in part on the aggregated utility data. A remote server 606 may detect the optimized location based on processing the aggregated utility data using preconfigured algorithms, techniques, rules, and/or parameters. The processing may include, for example, comparing the utility data pertaining to a specific buried utility, obtained from different sources (e.g., different locating devices and/or vehicles) to identify an optimal location of the buried utility. The sources, i.e., locating devices and/or the vehicles may be assigned with unique identifiers, which may be utilized by the remote server 606 for uniquely identifying the utility data obtained from different sources. The processing may further include ranking the utility data, based on predefined parameters or using preconfigured ranking algorithms to identify an optimal location of the buried utility, which in this example, may be a highest ranked location.

The processing may further include correlating the utility data along with associated timestamps in the time domain. The correlation may include arranging/rearranging the location data points in an order of the time domain, and combining the arranged location data points to detect and trace the location of the utility. Also, the processing may include executing preconfigured optimization algorithms to identify an optimal location of the buried utility. The processing may either be post-processing, real-time processing, or near real time processing. In the context of the present subject matter, the term 'optimal location' or 'optimized location' may refer to a most probable location of the utility, or a highly ranked location of the utility, or a maximum reported location of the utility (e.g., location reported by majority of the locating devices).

At block 906, the method may include generating a map indicative of the optimized location of the buried utility. The remote server 606 may generate one or more maps 512 depicting location of the buried utilities 106 and other associated attributes of the buried utilities, such as depth and orientation. The map(s) 512 may be provided to corresponding users on their respective electronic devices 510, via a suitable communication channel 702.

At the electronic device 510, the obtaining, detecting and generating steps may be repeated, upon occurrence of any changes to the utility data, to dynamically update the map 512 to display an updated location/position of the buried utility 106. This may be done, for example, when the map or navigation is active on the electronic device 510.

The map 512 may be a video tour of the geographical region showing the location of the buried utility 106 and associated attributes. The virtual tour may be compatible to be viewed and/or experienced in real world using known virtual reality devices that enable a user to immerse into a virtual environment realistically to experience the location of the buried utility 106.

The map 512 may be a heat map whereby a hierarchy of gradient and/or gradient tensor values may be represented by color, shading, patterns, and/or other representation of measured gradients at locations within the map.

Figure 9B:
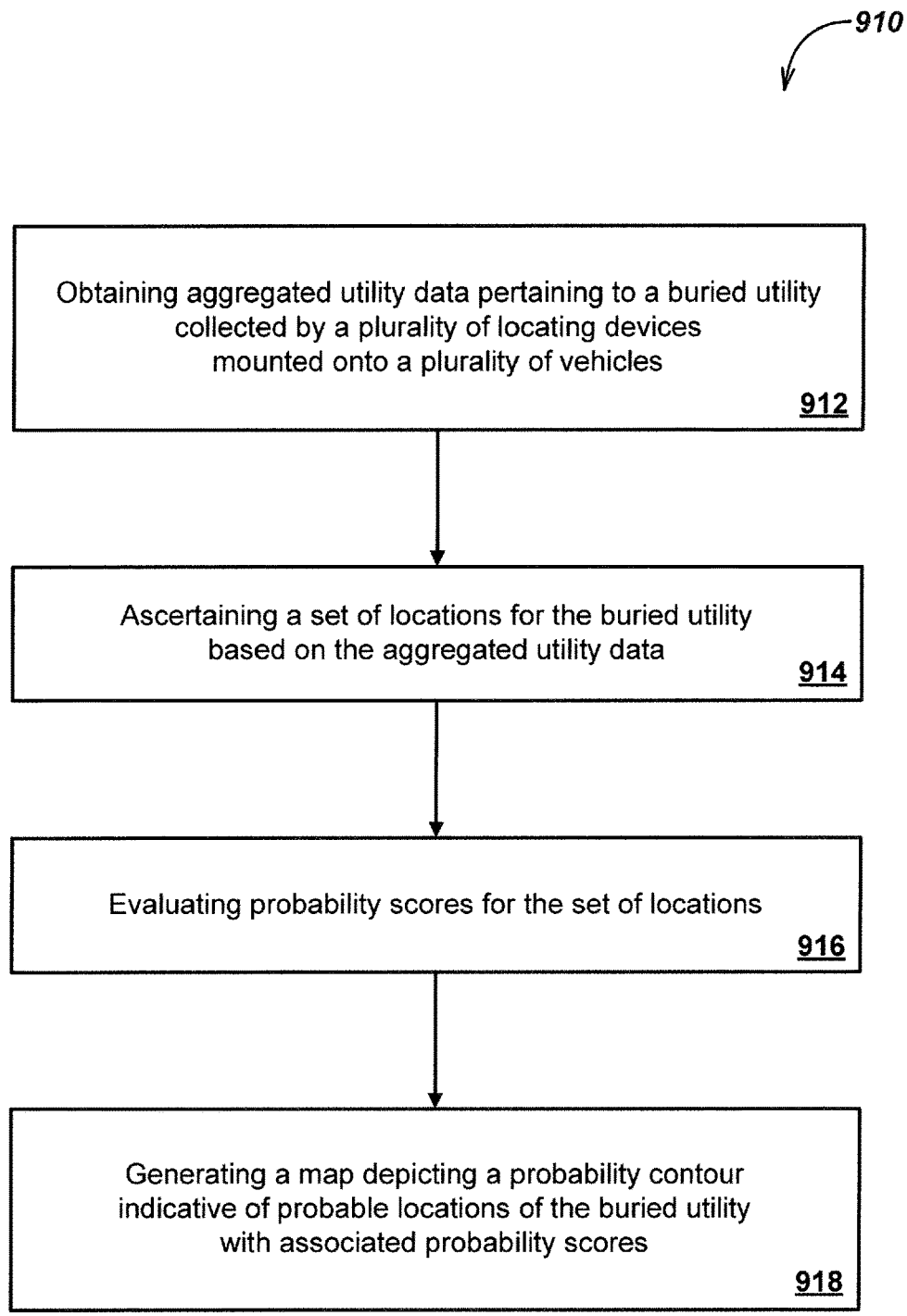
FIG. 9B illustrates another embodiment of a method for locating and/or mapping buried utilities using vehicle-mounted locating devices.

FIG. 9B illustrates an embodiment of a method 910 for locating and/or mapping buried utilities using vehicle-mounted locating devices.

At block 912, the method may include obtaining aggregated utility data pertaining to a buried utility 106 collected by a plurality of locating devices 102 mounted onto a plurality of vehicles 104 moving along a path of the buried utility. The utility data may include discrete data including geographic references in terms of a latitude and longitude. Further, the utility data may include data in the form of probability distributions. The probability distribution types may include normal or Gaussian, exponential or log normal, beta or spline, triangular, rectangular or trapezoidal, histogram, etc. The term aggregated utility data, as used herein, refers to utility data pertaining to a common buried utility obtained from multiple sources, for example, a plurality of locating devices 102 mounted on a plurality of moving vehicles 104.

According to an embodiment, the method of aggregating the utility data may include obtaining the utility data from a plurality of locating devices 102 mounted on a plurality of moving vehicles 104, and processing the utility data to determine if the utility data pertains to a common buried utility. The processing may involve matching spectral signatures and harmonics data, which upon matching indicates the utility data that pertains to a common buried utility. The method may additionally include applying pre-configured algorithms and/or rules to aggregate the utility data. Such an aggregated utility data may be stored in a database 608 associated with the remote server 606, from where the aggregated utility data may be retrieved, when required.

At block 914, the method may include ascertaining a set of locations for the buried utility 106 based on the aggregated utility data. A remote server 606 may be configured to receive the aggregated utility data and subsequently process the aggregated utility data using preconfigured probability algorithms, techniques, rules, and/or parameters to generate a set of locations, which may be identified in terms of data points within a geographical region. The processing may include correlating the aggregated utility data along with associated timestamps in the time domain to arranging/rearranging the set of locations in an order of the time domain.

At block 916, the method may include evaluating probability scores for the set of locations. The remote server 606 may be configured to evaluate probability scores for the identified set of locations, say, a probability score for each of the data points. The remote server 606 may apply preconfigured probability algorithms to evaluate the probability scores.

At block 918, the method may include generating a map 512 depicting a probability contour indicative of probable locations of the buried utility 106 with associated probability scores. For example, based on the set of locations and the associated probability scores, the remote server 606 may be configured to generate a map 512, for example, a probability contour 730 indicative of probable locations of the buried utility. In one example, the probability contour 730 is achieved based on joining the identified data points in view of corresponding probability scores. The remote server may generate such a map 512 based on a preconfigured algorithm or software. The map 512 may be provided to a user on an electronic device 510, which may be wirelessly coupled to the remote server 606, via a suitable communication link 702. The map 512 may be dynamically updated to depict updated probable locations of the buried utility, on the electronic device 510.

The methods 800, 900, and 910 described above, in accordance with various embodiments of the present disclosure, may be implemented in a computing device. Further, the methods may be described in the general context of computer executable instructions, which may include routines, programs, objects, components, data structures, procedures, modules, functions, etc., that perform particular functions or implement particular data types. The methods may also be practiced in distributed computing environments that are linked through a communications network.

Further, the order in which the methods 800, 900, and 910 are described is not intended to be construed as a limitation, and any number of the described method blocks can be combined in any order to implement the methods, or alternative methods. Additionally, individual blocks may be deleted from the methods without departing from the spirit and scope of the subject matter described herein.

In one or more exemplary embodiments, the functions, methods, and processes described may be implemented in whole or in part in hardware, software, firmware, or any combination thereof. If implemented in software, the functions may be stored on or encoded as one or more instructions or code on a computer-readable medium. Computer-readable media include computer storage media. Storage media may be any available media that can be accessed by a computer.

By way of example, and not limitation, such computer-readable media can include RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The various illustrative functions, modules, and circuits described in connection with the embodiments disclosed herein with respect to locating and/or mapping, and/or other functions described herein may be implemented or performed in one or more processing units or modules with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The disclosures are not intended to be limited to the aspects shown herein, but are to be accorded the full scope consistent with the specification and drawings, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c.

The previous description of the disclosed aspects is provided to enable any person skilled in the art to make or use embodiments of the present invention. Various modifications to these aspects will be readily apparent to those skilled in the art, and the generic principles defined herein may be applied to other aspects without departing from the spirit or scope of the disclosure and invention. Thus, the invention is not intended to be limited to the aspects shown herein but is to be accorded the widest scope consistent with the disclosures herein, the appended drawings, and their equivalents.

I claim:

1. A system for determining buried utility information, the system comprising:
a plurality of magnetic field sensing locating devices for sensing AC magnetic fields emitted as a result of current flowing in the buried utility, including at least a first locating device and a second locating device mounted on a vehicle, to determine data associated with a location of the buried utility;
a support assembly made of at least partially non-metallic and non-electrically conductive material, the support assembly including an elongated frame attached to and extending transversely from a hitch receiver of the vehicle and spaced-apart locator mounting assemblies fixed to the elongated frame to receive and support the corresponding first and second locating devices; and
a positioning device supported on an elongated mast projecting outwardly from the support assembly, the positioning device coupled to the first locating device and to the second locating device to generate absolute positional data of the buried utility based at least in part on the data determined by the first locating device and the second locating device;
wherein the vehicle consists of one of an automobile, a sport utility vehicle, and a truck, and wherein the vehicle is moving faster than about 10 meters per second during the magnetic field sensing.

2. The system of claim 1, wherein the first and second locating devices each generate and associate timestamps with the determined data in response to receiving a precise pulse synchronization signal obtained from the positioning device.

3. The system of claim 1, wherein the data determined by the first locating device is correlated with data determined by the second locating device based at least in part on the associated timestamps to generate the absolute positional data of the buried utility.

4. The system of claim 1, wherein the positioning device is one of a high precision global position system (GPS) system and a Global Navigation Satellite System (GNSS) system.

5. A system for determining buried utility information, the system comprising
a positioning device supplying a precise pulse synchronization signal;
a magnetic field sensing locating device mounted on a vehicle and coupled to the positioning device, the magnetic field sensing locating device includes:
at least one antenna node to sense magnetic fields emitted from a buried utility while moving along or across a path of the buried utility; and
a processing unit coupled to the antenna node to receive the sensed magnetic fields and determine information pertaining to a location of the buried utility upon based on the sensed magnetic fields, wherein the processing unit includes a timing circuit programmed to timestamp at least a portion of the determined information relative to the precise pulse synchronization signal obtained from the positioning device;
wherein the vehicle consists of one of an automobile, a sport utility vehicle, and a truck and wherein the vehicle is moving faster than about 10 meters per second during the magnetic field sensing.

6. The system of claim 5, wherein the positioning device is a Global Positioning System (GPS), and the precise pulse synchronization signal is a one pulse per second (1PPS) signal obtained from the GPS.

7. A system for locating and/or mapping buried utilities, the system comprising:
a positioning device including a master clock; and
a plurality of magnetic field sensing locating devices for sensing AC magnetic fields emitted from current flowing in a buried utility in three orthogonal axes, the magnetic field sensing locating devices mounted on a vehicle and coupled to the positioning device, the plurality of magnetic field sensing locating devices including at least:
a first locating device mounted on a vehicle to determine data associated with location of a buried utility at a first set of data points within a geographical region, the first locating device including a first slave clock programmed to synchronize to the master clock to timestamp the determined data at each of the first set of data points; and a second locating device mounted on the vehicle to determine data associated with location of the buried utility at a second set of data points within the geographical region, the second locating device including a second slave clock programmed to synchronize to the master clock to timestamp the determined data at each of the second set of data points; and a processing unit coupled to the first and second locating devices and to the positioning device to receive and process the timestamped data at the first set of data points and the time stamped data at the second set of data points in a time domain to determine absolute positional data of the buried utility within the geographical region;

wherein the vehicle consists of one of an automobile, a sport utility vehicle, and a truck and wherein the vehicle is moving faster than about 10 meters per second during the magnetic field sensing.

8. The system of claim 7 further comprising a non-transitory memory to store the timestamped data.

9. The system of claim 7 further comprising a remote server coupled to the first locating device, the second locating device, and to a plurality of other locating devices mounted on other vehicles to obtain and process the timestamped data to determine an optimized location information associated with the buried utility.

10. The system of claim 7, wherein the geographical region is a busy street, a highway, or a freeway.

11. The system of claim 7, wherein the positioning device is one of a high precision global position system (GPS) system and a Global Navigation Satellite System (GNSS) system.

12. A system for determining buried utility information, the system comprising:

a plurality of magnetic field sensing locating devices mounted on a plurality of vehicles, each vehicle having at least one magnetic field sensing locating device for sensing magnetic fields in three orthogonal axes mounted thereto, the magnetic field sensing locating devices sense one or more buried utilities and determine data associated with the buried utilities, wherein the data is determined based at least in part of a velocity information associated with corresponding vehicles moving along or across a path of the buried utilities; and a remote server communicatively coupled to the magnetic field sensing locating devices to receive and store the data obtained collaboratively from the magnetic field sensing locating devices into a non-transitory memory, wherein the stored collaborated data is retrievable and further processed to determine location information associated with the buried utilities;

wherein the vehicles each consist of one of an automobile, a sport utility vehicle, and a truck and wherein the vehicle is moving faster than about 10 meters per second during the magnetic field sensing.

13. The system of claim 12, wherein the data pertaining to each individual buried utility is aggregated and stored separately into the non-transitory memory.

14. The system of claim 12, wherein a mapping unit is coupled to or integrated within the remote server to generate a map depicting location of each of the buried utilities based in part on the determined location information.

15. The system of claim 12, wherein the location information includes at least a position, a depth, and an orientation of buried utilities.

16. A method for determining and mapping buried utility information, the method comprising:

obtaining at one or more magnetic field sensing locating devices mounted on a vehicle, data associated with sensing multi-frequency AC magnetic field signals and radio broadcast signals radiated from a buried utility in three orthogonal axes;

receiving a velocity information associated with the vehicle;

processing the sensed data in conjunction with the velocity information to determine information associated with a location of the buried utility; and generating a map depicting the determined location information of the buried utility for display on an electronic device associated with the vehicle;

wherein the vehicle consists of one of an automobile, a sport utility vehicle, and a truck, wherein the vehicle is moving faster than about 10 meters per second during the magnetic field sensing.

and wherein the magnetic field sensing locating devices sense a direct signal component of the radio broadcast signal and the radiated component of the broadcast signal from the buried utility and process the broadcast signal components to separate the direct broadcast component of the radio broadcast signal from combination of the radiated broadcast signal component and the direct broadcast signal component.

17. The method of claim 16, further comprising updating the location information of the buried utility on the map as the vehicle moves along or across a path of the buried utility.

18. The method of claim 16, further comprising providing an audio and/or visual feedback to an operator of the vehicle when the vehicle moves away from a path of the buried utility.

19. A method for determining and mapping buried utility information, the method comprising:

obtaining data associated with location of a buried utility from a plurality of magnetic field sensing locating devices mounted onto a plurality of different vehicles moving along or across a path of the buried utility;

correlating the location data obtained from a plurality of different motorized vehicles;

determining an optimized location information associated with the buried utility based at least in part on the correlation; and generating a map depicting the optimized location information associated with the buried utility for display on an electronic device associated with the corresponding vehicles;

wherein the different vehicles each consist of one of an automobile, a sport utility vehicle, and a truck, wherein the vehicle is moving faster than about 10 meters per second during the magnetic field sensing.

20. The method of claim 19, wherein the location data comprises a plurality of data points.

21. The method of claim 19, further comprising ranking data points associated with the location data.

22. The method of claim 21, wherein the optimized location information is determined based in part on the ranking.

23. The method of claim 19, wherein the data points are associated with corresponding timestamps.

24. The method of claim 23, wherein the data points from the plurality of different motorized vehicles are correlated based on the associated timestamps to determine the optimized location information associated with the buried utility.

25. A method for determining and mapping buried utility information, the method comprising:
   obtaining, collaboratively, data associated with location of a buried utility from a plurality of magnetic field sensing locating devices mounted onto a plurality of different motorized vehicles moving along or across a path of the buried utility;
   ascertaining a set of locations for the buried utility based on the collaborated location data;
   evaluating probability scores for the set of locations; and
   generating a map depicting a probability contour indicative of probable locations of the buried utility based in part on the probability scores;
   wherein the different motorized vehicles each consist of one of an automobile, a sport utility vehicle, and a truck, wherein the motorized vehicles are moving faster than about 10 meters per second during the magnetic field sensing.

26. The method of claim 25, wherein the data are associated with corresponding timestamps.

27. The method of claim 25, wherein the data obtained from the plurality of different motorized vehicles are correlated based on at least on the associated timestamps to ascertain the set of locations for the buried utility.

\* \* \* \* \*